United States Patent
Watson et al.

(10) Patent No.: US 7,200,825 B2
(45) Date of Patent: Apr. 3, 2007

(54) METHODOLOGY OF QUANTIFICATION OF TRANSMISSION PROBABILITY FOR MINORITY CARRIER COLLECTION IN A SEMICONDUCTOR CHIP

(75) Inventors: Anne E. Watson, Essex Junction, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 10/711,143

(22) Filed: Aug. 27, 2004

(65) Prior Publication Data
US 2006/0048080 A1 Mar. 2, 2006

(51) Int. Cl.
- G06F 17/50 (2006.01)
- G06F 17/10 (2006.01)
- G06F 19/00 (2006.01)
- G01R 29/02 (2006.01)
- G01R 27/28 (2006.01)
- G01R 31/26 (2006.01)
- G01R 29/26 (2006.01)

(52) U.S. Cl. .............. 716/6; 703/2; 703/16; 324/628; 324/620; 324/637; 324/613; 324/765; 702/69; 702/79

(58) Field of Classification Search ............ 716/5; 702/69, 79; 324/765, 613, 620, 628, 637; 703/2, 16
See application file for complete search history.

(56) References Cited

U.S. PATENT DOCUMENTS

| | | | |
|---|---|---|---|
| 4,581,578 A * | 4/1986 | Honma et al. ............ 324/767 |
| 5,117,377 A * | 5/1992 | Finman ........................ 703/2 |
| 5,337,261 A * | 8/1994 | Rogers ...................... 702/190 |
| 5,559,050 A | 9/1996 | Alsmeier et al. |
| 5,638,286 A | 6/1997 | Fujimoto |
| 5,677,846 A * | 10/1997 | Kumashiro ................. 716/20 |
| 5,774,696 A * | 6/1998 | Akiyama .................... 716/20 |
| 5,812,434 A * | 9/1998 | Nagase et al. ................ 703/2 |
| 6,118,129 A * | 9/2000 | Oae et al. .............. 250/492.22 |
| 6,490,709 B1 | 12/2002 | Kimura et al. |
| 6,493,850 B2 | 12/2002 | Venugopal et al. |
| 6,553,542 B2 | 4/2003 | Ramaswamy et al. |
| 6,601,025 B1 * | 7/2003 | Ditlow et al. ................ 703/14 |
| 6,794,674 B2 * | 9/2004 | Kusumoto ................. 327/524 |
| 7,058,917 B1 * | 6/2006 | Teig et al. .................... 716/12 |
| 7,096,174 B2 * | 8/2006 | Beattie et al. ............... 703/14 |

(Continued)

FOREIGN PATENT DOCUMENTS

JP 2020039 1/1990

OTHER PUBLICATIONS

NN9610135, "New Devices Using Mixed (Ion and Electron) Conductors", IBM Technical Disclosure Bulletin, vol. 39, No. 10, Oct. 1996, pp. 135-140 (7 pages).*

(Continued)

Primary Examiner—Phallaka Kik
(74) Attorney, Agent, or Firm—Whitham, Curtis, Christofferson & Cook, PC; Richard M. Kotulak

(57) ABSTRACT

A method for computer aided design of semiconductor chips which minimizes sensitivity to latchup is provided. The method evaluates electron transmission, reflection and absorption at geometric shapes that represent components of the semiconductor.

21 Claims, 22 Drawing Sheets

U.S. PATENT DOCUMENTS

| | | | |
|---|---|---|---|
| 7,103,487 B2* | 9/2006 | Roach | 702/64 |
| 2002/0042698 A1* | 4/2002 | Meuris et al. | 703/2 |
| 2003/0069722 A1* | 4/2003 | Beattie et al. | 703/14 |
| 2003/0074641 A1 | 4/2003 | Kimura et al. | |
| 2003/0161526 A1* | 8/2003 | Jupiter et al. | 382/154 |
| 2005/0261846 A1* | 11/2005 | Roach | 702/64 |

OTHER PUBLICATIONS

NN79081265, "Generator for Domain Drag Devices", IBM Technical Disclosure Bulletin, vol. 22, No. 3, Aug. 1979, pp. 1265-1267 (4 pages).*

Maci et al., "Green's Functions of an Infinite Slot Printed Between Two Homogeneous Dielectrics—Part II: Uniform Asymptotic Solution", IEEE Transactions on Antennas and Propagation, vol. 52, No. 3, Mar. 2004, pp. 666-676.*

Aksun et al., "Effcient Calculation of Spurious Radiation From Microstrip Interconnects", IEEE Antennas and Propagation Society International Symposium, vol. 3, 18 Jul. 1992, pp. 1641-1644.*

Calhoun, "A Finite Difference Time Domain (FDTD) Simulation of Electromagnetic Wave Propagation and Scattering in a Partially Conducting Layered Earth", 1997 IEEE International Goscience and remote Sensing, vol. 2,3 Aug. 1997, pp. 922-924.*

Substrate Modeling and Lumped Substrate Resistance Extraction for CMOS ESD/Latchup Circuit Simulation, T. Li, et al., Coordinated Science Laboratory, Dept. of Electrical and Computer Engineering University of Illionois at Urbana-Champaign, Urbana, IL (1999), 6 pages, 1999 ACM.

Bipolar Transistor Action And Transport Effects Relating To CMOS Latchup, G. Krieger, IEEE Transactions on Electron Devices, vol. ED-34, No. 8, Aug. 1987, pgs. 1719-1728.

Parasitic Lateral Bipolar Transistors In CMOS, L. Deferm, et al., Solid-State Electronics, vol. 32 No. 2, pgs 103-109, 1989.

A New Analytical Three-Dimensional Model For Substrate Resistance In CMOS Latchup Structures, M. Chen, et al., IEEE Transactions on Electron Devices, vol. ED-33 No. 4 pgs. 489-493, Apr. 1986.

Static and Transient Latchup Simulation Of VLSI-CMOS With An Improved Physical Design Model, M. Strzempa-Depre, et al., IEEE Transactions on Electron Devices, vol. ED-34 No. 6, Jun. 1987, pgs 1290-1296.

A CMOS Model For Computer-Aided Circuit Analysis And Design, J. W. Roberts, et al., IEEE Journal of Solid-State Circuits, vol. 24, No. 1, Feb. 1989, pgs 128-138.

Correlating The Channel, Substrate, Gate And Minority-Carrier Currents In Mosfets, C. Hu et al., IEEE International, Solid-State Circuits Conference, Digest of Technical Papers Feb. 1983, pgs. 88-90.

* cited by examiner

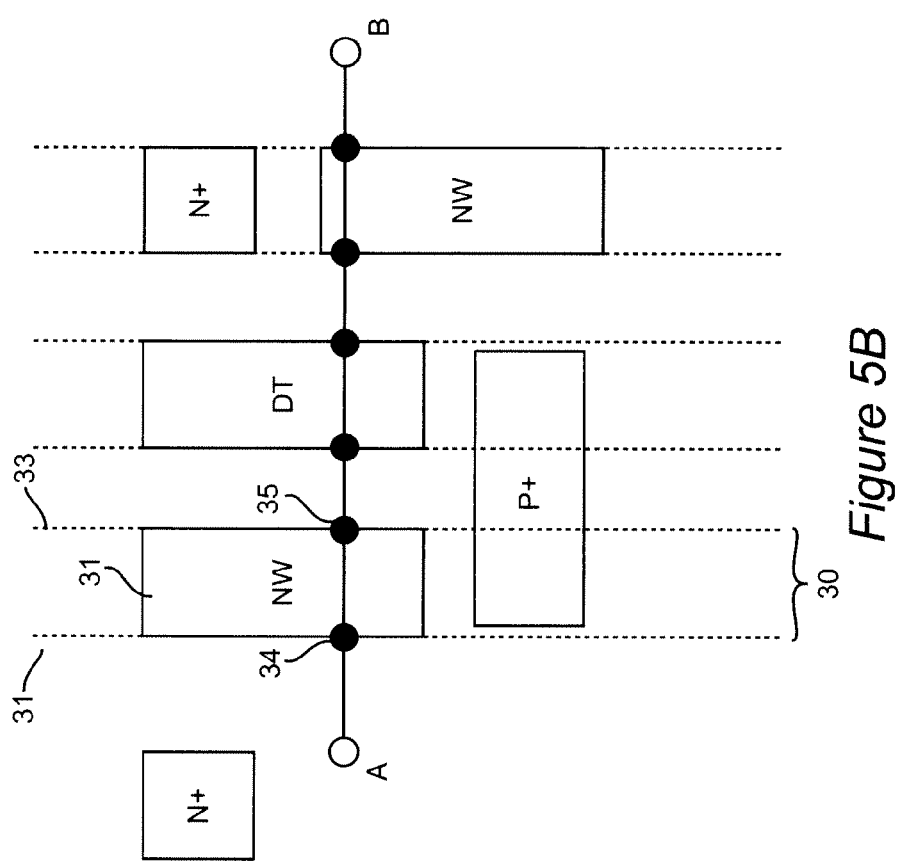

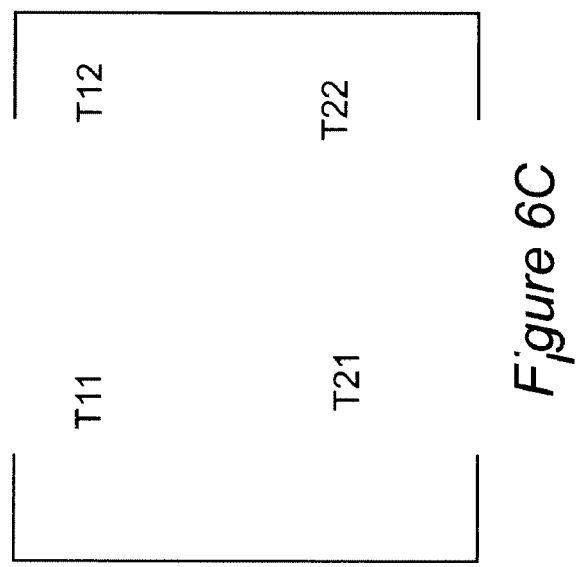

METHODOLOGY OF QUANTIFICATION OF TRANSMISSION PROBABILITY FOR MINORITY CARRIER COLLECTION IN A SEMICONDUCTOR CHIP

BACKGROUND OF INVENTION

1. Field of the Invention

The invention generally relates to computer aided semiconductor design methods and semiconductor designs and structures which are produced using those methods. In particular, the invention provides methods for evaluating minority carrier transmission for noise and latchup in a semiconductor chip.

2. Background of the Invention

As the electronic components and internal structures of integrated circuits are becoming smaller and smaller, they are being placed closer together on the substrate surface. As a result, the electronic components are, unfortunately, becoming more and more susceptible to impairment and/or destruction due to "latchup". Latchup occurs when a pnpn structure transitions from a low current, high voltage state to a high current, low voltage state through a negative resistance region, i.e. when an S-Type I-V (current/voltage) characteristic is formed. Latchup can occur anywhere there is a PNPN structure and excess minority carriers. PNPN structures are ubiquitous in semiconductor devices, particularly CMOS, and excess minority carriers (e.g. electrons) can be developed from many sources.

Latchup is typically understood as occurring within a pnpn structure, such as a silicon controlled rectifier (SCR) structure. These pnpn structures can be either intentionally designed or unintentionally formed between structures. Hence, latchup conditions can occur within peripheral circuits or internal circuits, within one circuit (intra-circuit) or between multiple circuits (inter-circuit).

Latchup is typically initiated by the PNPN structure forming an equivalent of a circuit having cross-coupled pnp and npn transistors. With the base and collector regions being cross-coupled, current flows from one device leading to the initiation of conduction of the second device ("regenerative feedback"). These pnp and npn elements can be any diffusions or implanted regions of other circuit elements (e.g. P-channel Metal Oxide Semiconductor Field Effect Transistors (MOSFETs), NChannel MOSFETs, resistors, etc.) or actual pnp and npn bipolar transistors. In Complementary Metal Oxide Semiconductors (CMOS), the pnpn structure can be formed with a p-diffusion in an nwell, and in an ndiffusion in a p-substrate or p-well (parasitic pnpn). In this case, the well and substrate regions are inherently involved in the latchup current exchange between regions.

The condition for triggering latchup is a function of the current gain of the pnp and npn transistors, and the resistance between the emitter and the base regions. This inherently involves the well and substrate regions. The likelihood or sensitivity of a particular pnpn structure to excess minority carriers and latchup is a function of spacings (e.g. base width of the npn and base width of the pnp), bipolar current gain of the transistors, substrate resistance and spacings, the well resistance and spacings, and isolation regions.

Excess minority carriers and latchup can be initiated from internal or external stimuli. Latchup is known to occur from single event upsets (SEUs). SEUs include terrestrial emissions from nuclear processes and cosmic ray events, as well as events in space environments. For example, terrestrial emissions from radioactive events, such as alpha particles and other radioactive decay emissions, can lead to latchup in semiconductors. Cosmic rays, a number of which are known to enter the earth's atmosphere, include proton, neutron, and gamma emissions, and are also known to cause latchup.

Latchup can also occur as a result of voltage or current pulses in power supply lines (VDD and substrate ground VSS). For example, latchup can be initiated by a negative transient on the VDD power rail which can lead to a forward biasing of all the ndiffusions and nwell structures and electron injection throughout the semiconductor chip substrate. This produces a "sea of electrons" injected in the chip substrate. Equivalently, a positive transient on the VSS power rail can lead to hole injection, and forward biasing of the substrate-well junction providing a "sea of holes" event. Further, latchup can also occur from a stimulus from a minority carrier to the well or substrate external to the region of the thyristor structure. Excess numbers of minority or majority carriers less than sufficient to cause latchup can nevertheless appear in signals as noise.

In both internal circuits and peripheral circuitry, latchup is a concern. Latchup also occurs as the result of interactions of Electrostatic Discharge (ESD) devices, I/O off-chip drivers, and adjacent circuitry initiated in the substrate from overshoot and undershoot phenomenon. Simultaneous switching of circuitry, where overshoot and undershoot injection occurs, may lead to carrier injection into the substrate which causes both noise injections and latchup conditions. Supporting elements in these circuits, such as pass transistors, resistor elements, test functions, over-voltage dielectric limiting circuiting, bleed resistors, keeper networks, and other elements can also contribute to injection into the substrate. Electrostatic discharge (ESD) elements connected to the input pad (including MOSFETs, pnpn Semiconductgor-Controlled Rectifier (SCR, i.e. thyristor), ESD structures, p+/nwell diodes, nwell-to-substrate diodes, n+ diffusion diodes, and other ESD circuits) may also contribute to noise injection and latchup.

Latchup is a higher risk in regions where the incoming voltage exceeds the native power supply voltage of the chip. Circuits, input pins or power rails which receive voltages that far exceed the native voltage, are sources for latchup concern. Examples include regions of semiconductor chips that provide programmable Non-Volatile Random Access Memory (NVRAM) power pins, mixed voltage off-chip driver circuits, mixed voltage ESD networks, mixed voltage receiver networks, and mixed voltage ESD power clamps are all sources for latchup concern. Placement of circuit blocks and circuit functions with a high density of pnpn devices, or weakly robust networks that are near the high voltage supply, are especially vulnerable to trigger latchup in a chip.

Many different stimuli and network functions exist in a semiconductor environment. Peripheral circuits include ESD networks, transmitter and receiver networks, system clocks, phase lock loops, capacitors, decoupling capacitors and fill shapes. Internal circuits include Dynamic Random Access Memory (DRAM) memory, Static Random Access Memory (SRAM) memory, gate arrays and logic circuitry. These regions form shapes both in and outside the silicon substrate. The regions inside the silicon substrate are those which allow electrons to 1) escape or 2) to be trapped. At any closed circuit domain region, the sum of probability of trapping and the probability of escaping is unity.

$$P(\text{trapping}) + P(\text{escaping}) = 1$$

The trapping probability is defined by quantifying the spatial regime at which the electron is trapped either by collection from an n-diffusion, n-well, or n-resistor shape in a p-silicon substrate. The trapping probability also includes the recombination of an electron (e.g. minority carrier) with a majority carrier inside the domain or defined region. Trapping probability is also influenced by trench structures such as deep trench (DT), trench isolation (TI) and shallow trench isolation (STI) via surface recombination, or reflection of the carrier into the space preventing transmission to outside of the physical domain.

A second perspective is that electrons injected into the substrate are either 1) collected at a junction region, or 2) recombine in the bulk or at an interface. Hence, the probability that an electron is collected plus the probability that an electron recombines equals unity.

$$P(\text{recombine})+P(\text{collected})=1$$

The probability of escape is the probability that an electron is collected or recombines outside the domain of interest. From this perspective, the probability of a guard ring collection is the current measured at an additional ring outside of the guard ring and the p+ substrate contact outside of the guard ring normalized to the injection current. The probability that an electron escapes from a guard ring or series of guard rings, is the current measured at an additional ring outside of the guard rings and the p+ substrate contact outside of the guard ring, normalized by the injection current. The efficiency of the ratio of captured electrons in the guard ring structure to the injected current is a measure of the guard ring efficiency. When the electron current outside of the guard ring is small compared to the current collected on an n-well diffusion, then the escaped collected current normalized to the injected current is also a metric for evaluation of the guard ring effectiveness (of lack thereof) or a measure of the probability of escape. Therefore, the transmission of minority carriers is related to the escape probability out of a physical region or boundary.

Protection against spurious transmission of minority carriers is generally avoided by guard rings or other shapes and structures in or on the silicon. However, such shapes and structures have differing levels of effectiveness in capturing or reflecting minority carriers. Further, the design of guard rings in the chip floor-plan has the undesirable effect of taking up additional space, already at a premium in the floor-plan.

The prior art has thus far failed to provide: a method to determine the probability of escape (or the probability of transmission outside a domain) in a chip environment; a method to determine the transmission probability of minority carriers from a first point in a semiconductor chip to a second point in a semiconductor chip; a method which can quantify the minority carriers that reach a physical region or device by evaluation of the transmission factors from the injection source to the collecting region on interest; a method, apparatus, or structure that predicts and improves the latchup tolerance and guard ring efficiency in a complex semiconductor environment by addressing global as well as local interactions; a method, apparatus, or structure that predicts latchup within a circuit function and between circuit functions in a complex semiconductor chip; a method, apparatus, or structure that predicts and improves latchup tolerance by addressing global and local temperature and how it influences the transmission probability with a physical domain, both locally and globally; a method that evaluates periodic "unit cells" and evaluates their transmission probability for evaluation of probability of a minority carrier transmitting through the unit cell; and a method that evaluates periodic "unit cells" and evaluates the global transmission probability for evaluation of probability of a minority carrier transmitting through a periodic array of unit cells or a function block of unit cells. Such methodology would be useful in order to predict which areas of a chip would be more or less susceptible to noise and latchup, and would thus allow for improved design of chip floorplans that are resistant to noise and latchup.

In a preferred embodiment of the invention, a computer aided design apparatus is provided. The apparatus comprises a graphics generator, a schematic generator, and a graphical unit interface containing a parameterized cell. The parameterized cell is defined by the graphics generator and the schematic generator, and contains transmission, absorption, and reflection parameters corresponding to the parameterized cell.

SUMMARY OF INVENTION

The present invention provides improved methods for the analysis of latchup and noise in a semiconductor environment. The invention provides methods to locate pnpn structures in an integrated circuit and evaluate their potential for latchup and noise. The ability to analyze a semiconductor environment in this manner permits prophylactic measures to be taken in the design of chip floorplans so that latchup and noise can be avoided.

It is an object of this invention to provide a method for evaluating minority carrier transmission in a semiconductor chip design. The method comprises the steps of forming a semiconductor chip design using shapes; defining an arc between a first point and a second point in the semiconductor chip design, wherein the arc crosses at least one of the shapes; defining one or more domains in relation to points on the arc; quantifying absorption, reflection and transmission characteristics of each domain along the arc; and evaluating total minority carrier transmission from the first point to the second point across the domains. In one embodiment of the invention, each of the domains is delimited by two normal planes, where each of the two normal planes includes a point co-located on the arc and on a perimeter of a shape. In another embodiment, each of the two normal planes includes a bisector of a section of the arc, the section being located between two adjacent points. The method may also include the steps of: removing shapes that are not in the substrate prior to the step of defining the arc; removing shapes within a well tub of a second doping polarity prior to the step of defining said arc; calculating electron current collected at the second point; and relating the arc to a pnpn structure. In one embodiment of the invention, the first and second points lie on a boundary of a circuit. In one embodiment, the step of evaluating is carried out by calculating a transmission matrix for total minority carrier transmission across the domains, and the matrix may be a higher order matrix.

The invention further provides a method for evaluating minority carrier transmission across an array of unit cells in a semiconductor chip design. The method comprises the steps of: forming the semiconductor chip design using shapes; b) evaluating, for each of the unit cells, minority carrier transmission across the unit cell by: defining an arc between a first point and a second point, wherein the first point and the second point are located on a boundary of the unit cell, and wherein the arc crosses at least one of the shapes; defining one or more domains in relation to points on the arc, quantifying absorption, reflection and transmission characteristics of each domain along said arc; and calculating an individual value for minority carrier transmission from the first point to the second point across the domains for the unit cell; c) defining a second arc from a point A to a point B across the array of unit cells; and d) evaluating total minority carrier transmission along the arc by multiplying together individual values of minority transmission for all unit cells in the array of unit cells along the second arc. In one embodiment of the invention, each of the domains is delimited by two normal planes, each of which includes one of the points co-located on the arc and on a perimeter of a shape. In another embodiments, each of the two normal planes includes a bisector of a section of the arc, the section being located between two adjacent points. The invention may further include the steps of: removing shapes that are not in the substrate prior to the step of defining the arc; removing shapes within a well tub of a second doping polarity prior to the step of defining the arc; and relating the arc to a pnpn structure. In a preferred embodiment of the invention, the unit cells are parameterized cells. In another embodiment of the invention, the array of unit cells is selected from the group consisting of DRAM arrays, SRAM arrays, decoupling capacitors, off-chip driver (OCD) banks, receiver banks, ESD input networks, ESD power clamps, analog circuitry, gate array logic regions, custom logic, voltage islands, wiring bays, fill shapes, p-cell libraries, and periodic circuit functions.

The invention further provides a computer aided design structure for evaluation of latchup and noise. The computer aided design structure includes a transmission probability generator; means for relating the transmission probability to domains or unit cells, or to domains and unit cells, along an arc; and means for relating the arc to a pnpn structure. In a preferred embodiment, the computer aided design structure further comprises elements selected from the group consisting of a graphical generator; a schematic generator; a technology data file source; a parasitic element identifier; a latchup criteria discriminator, a graph theory generator of parasitic pnpn elements; a current generator of secondary currents initiated by elements that undergo latchup; a primary current and secondary currents summing structure; a tree propagation generator; and a latchup propagation evaluator.

BRIEF DESCRIPTION OF DRAWINGS

FIG. 5A–C illustrates: A, intersection points (black dots) along arc AB; B, domains defined by a normal plane through intersection points; C, domains defined by a normal plane along a bisector.

FIG. 6A–C illustrates: A, a domain containing a deep trench (DT); B, data showing the relationship between trench depth and electron transmission; and C, a two-port matrix representation of electron transmission.

DETAILED DESCRIPTION

The present invention provides computer aided semiconductor design methods and semiconductor designs and structures which are produced using those methods. The methods are used to rapidly evaluate minority carrier transmission on a semiconductor chip. Evaluation of the potential for minority carrier transmission allows the prediction of noise and latchup on the chip, and thus permits the development of semiconductor designs which avoid noise and latchup.

Figure 1:
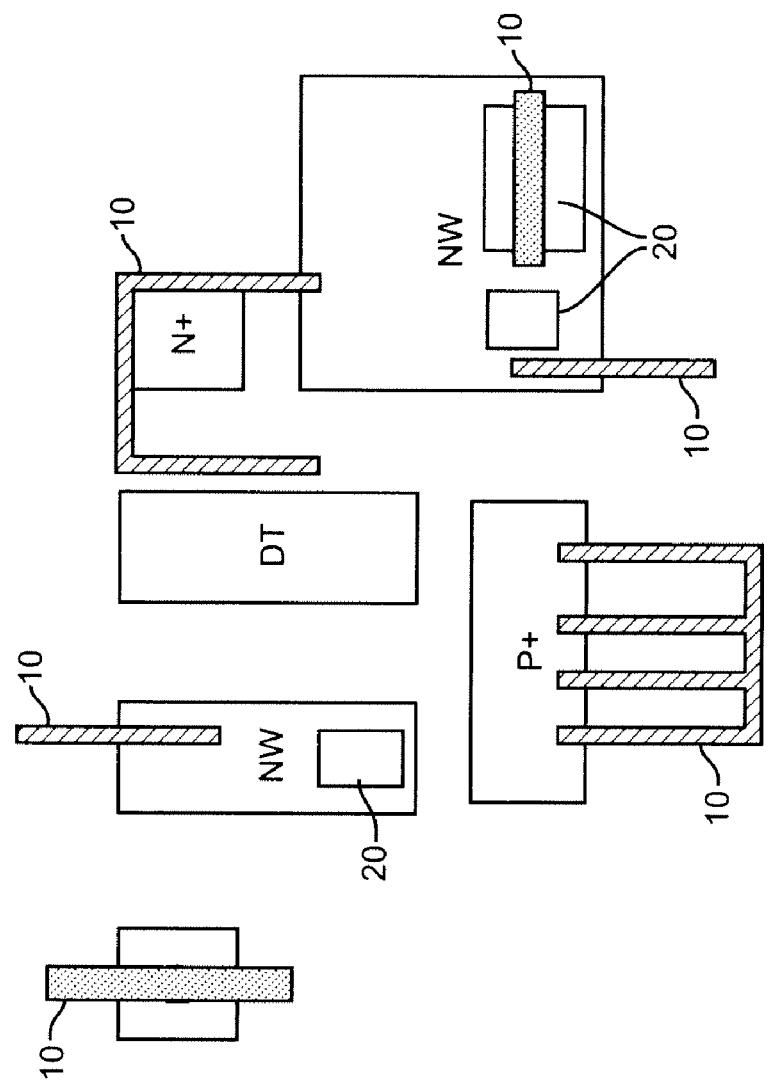
FIG. 1 is a representation of design shapes that may be used in a semiconductor.

In computer-aided semiconductor design, a substrate with a known doping polarity (e.g. p-substrate) is selected, and geometric shapes (or "shapes" as used herein) may then be used to define or represent the components of a semiconductor device that are associated with a region of interest in the substrate. In the present context, "region of interest" is taken to mean a collection of shapes located in an area of the microchip for which it is desired to determine the probability of transmission of electrons across the region or area. FIG. 1 depicts a semiconductor design where such geometric shapes represent both the front-end-of-line (FEOL) and back-end-of-line (BEOL) components in a region of interest. For example, FEOL components may include deep trench (DT), n well (NW), n+ diffusion diode (N+), p+ diode (P+), etc. BEOL components (10 in FIG. 1) can include metal levels, insulators, vias and contacts, fill shapes, polishing stops, etc., and are depicted as heavy black lines in FIG. 1. Design of shapes in silicon can prevent electron flow in the p-substrate. Thus, as a first step in the method of the present invention for rapid evaluation of the flow (transmission) of electrons, all BEOL shapes and BEOL mask levels 10 are eliminated. Additionally, electrons do not flow in the polysilicon film because of the dielectric insulator separating from the silicon substrate or wells; hence it is also an option to similarly eliminate polysilicon film masks.

Figure 2:
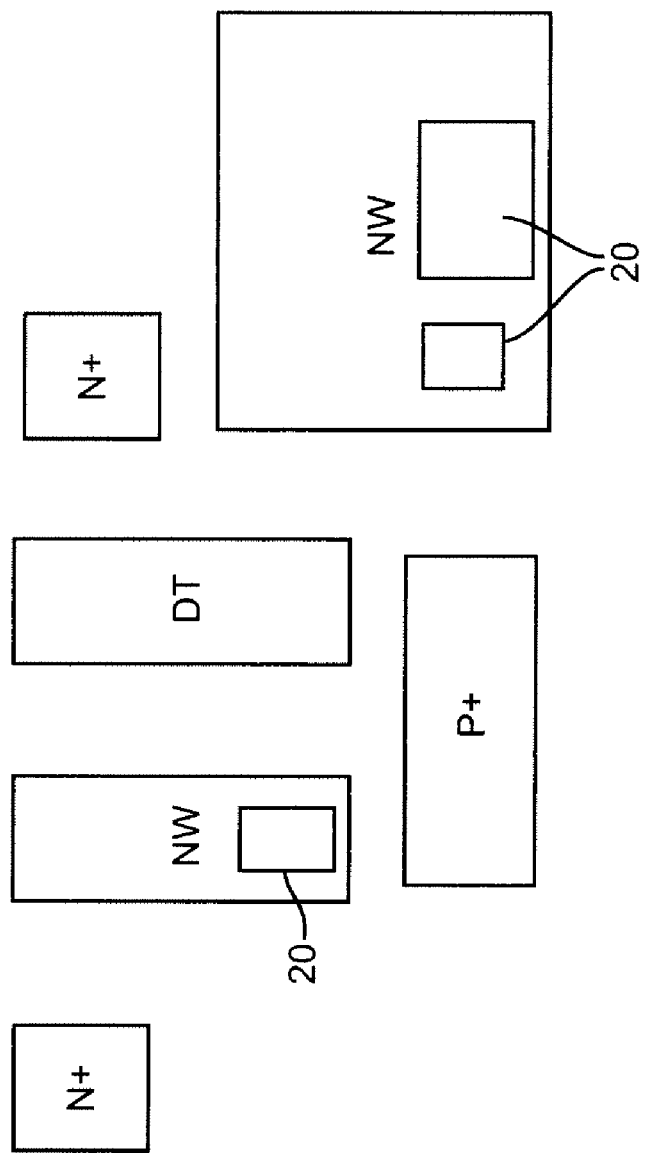
FIG. 2 is a representation of design shapes where metal and polysilicon shapes have been removed.

FIG. 2 illustrates a semiconductor design after the completion of the first step, i.e. after removal of metal shapes in the BEOL and polysilicon shapes 10 from the design. This leaves behind the shapes in the FEOL silicon region. For higher accuracy of the n-diffusion area, removal of the polysilicon mask is optional, i.e. the polysilicon mask can be left in for first cut analysis.

Figure 3:
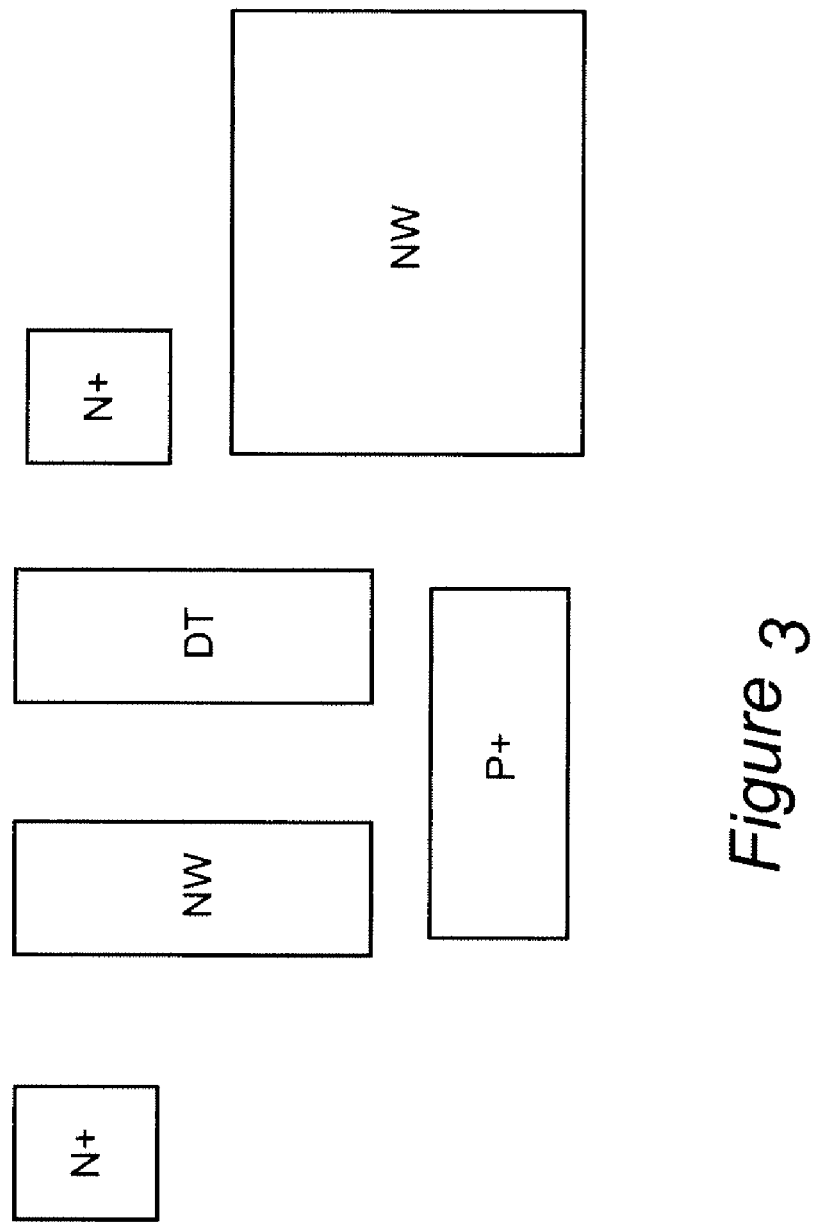
FIG. 3 is a schematic representation of design shapes where shapes within n-well regions are removed.

All diffusions inside the n-wells (such as all p-channel transistors) also do not interact with the electrons flowing in the substrate, and hence do not influence the trapping, recombination or escape in the substrate to first order. Hence, for simplicity, in a preferred embodiment, all p-channel shapes (20 in FIG. 2) in the n-well are eliminated. FIG. 3 illustrates the embodiment of the method where the shapes within the n-well regions 20 have been removed according to the described method.

The shapes of interest that remain associated with the semiconductor substrate are, for example, n-diffusions (N+), n-well shapes (NW), trench isolation (TI, not shown), deep trench (DT) isolation and p+ substrate contacts (P+), etc. When electrons flowing through the substrate encounter any of the structures represented by these shapes, the encounter leads to the reflection, absorption or transmission of the electrons. In the absence of electric fields, minority carriers move through diffusion processes in a random fashion ("random walk"). Additionally, built-in electric fields introduce drift components leading to currents in the direction of the built-in fields. Additionally, metallurgical junctions are locations of collection of the minority carriers. Hence at any boundary interface (i.e. the line which represents the perimeter of the structure or shape), the electrons are reflected from, absorbed at, or transmitted through the boundary of the structure or shape.

Figure 4:
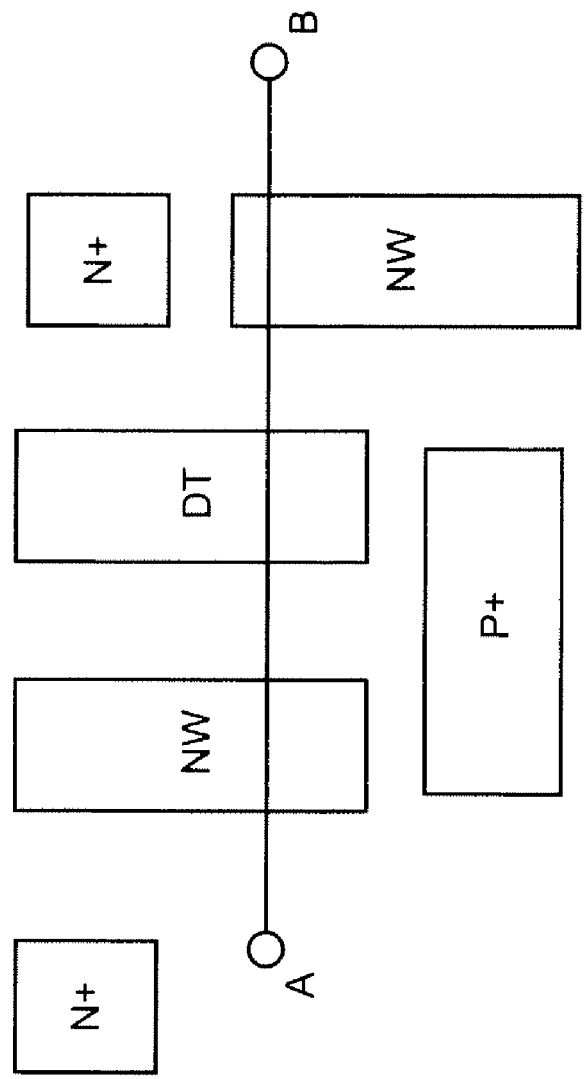
FIG. 4 shows an arc drawn from point A to point B.
Figure 5A:
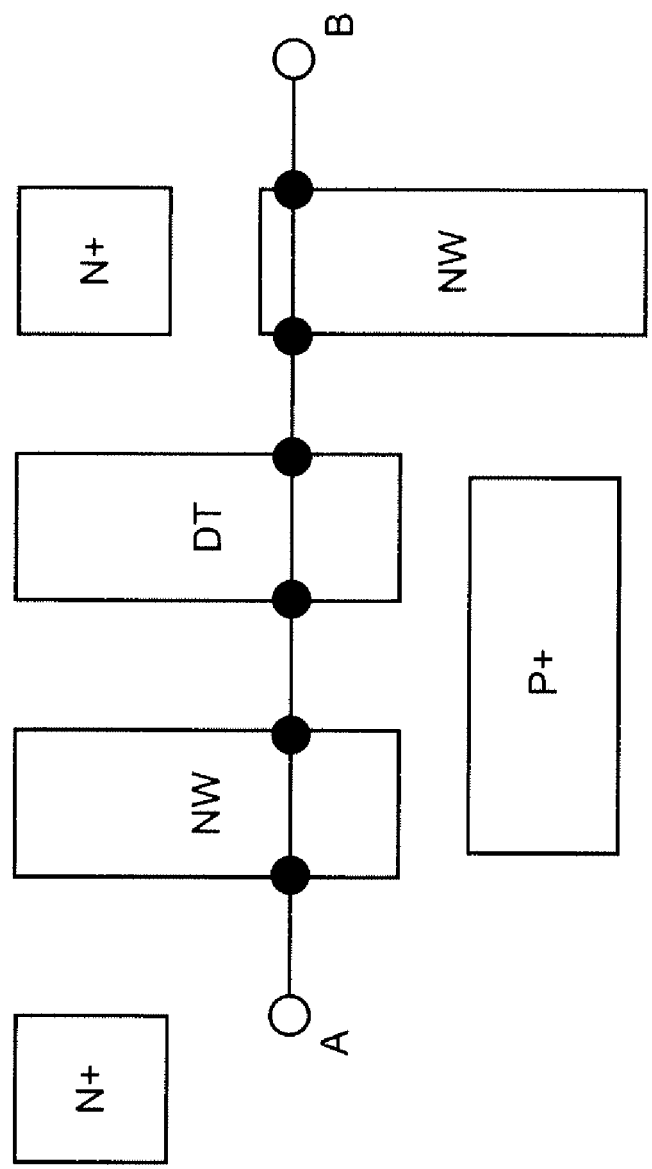

In order to trace a theoretical path that may be taken by electrons flowing through the substrate, (which may be related to pnpn structures in the substrate) an arc is drawn between two points on the substrate. Choice of the points is flexible and depends on the desired analysis, the first point typically being a point of minority carrier injection, and the second a point at which the effect of the injection occurs (e.g. a collection point at a circuit of interest where latchup can be initiated). FIG. 4 illustrates an arc that has been drawn from a first point A on the substrate (but outside the shapes) to a second point B on the substrate (also outside the shapes) and crossing at least one of the shapes. FIG. 5a illustrates "intersection points" along the arc where the arc intersects the boundary of a shape. Intersections points are shown as black dots. As illustrated in this figure, when moving along the arc from point A to point B, "intersection points" are located where the arc intersects the edge or perimeter of a shape, i.e. the points are co-located on the arc and on a perimeter of a shape. Two such intersection points are associated with each shape, the first on the "A" side of the shape, where an electron would first encounter the shape if traveling along the arc from A to B, and the second on the "B" side of the shape, where the electron would exit from the shape and reenter the substrate.

In the practice of the present invention, the physical space that is traversed by an electron by a diffusion process traveling along arc AB is divided into "domains" or "regions". Such domains are defined in relation to the intersection points, and two alternative preferred computational constructs of the invention are provided for defining domains. Other computational constructs are, of course, possible, but generally more complicated. In the first, domains are defined by first defining, for each intersection point, a plane normal to the substrate surface and which passes through the intersection point. The plane is perpendicular to the direction of arc AB and coincident with the boundary of the shape on which the intersection point is located. FIG. 5b illustrates such planes as dashed (dotted) lines. As can be seen in the figure, each plane is superimposed on a boundary and contains an intersection point. For example, the domain 30 that includes N-well 31 is defined by normal planes 32 and 33 which extend through intersection points 34 and 35, respectively.

Figure 5C:
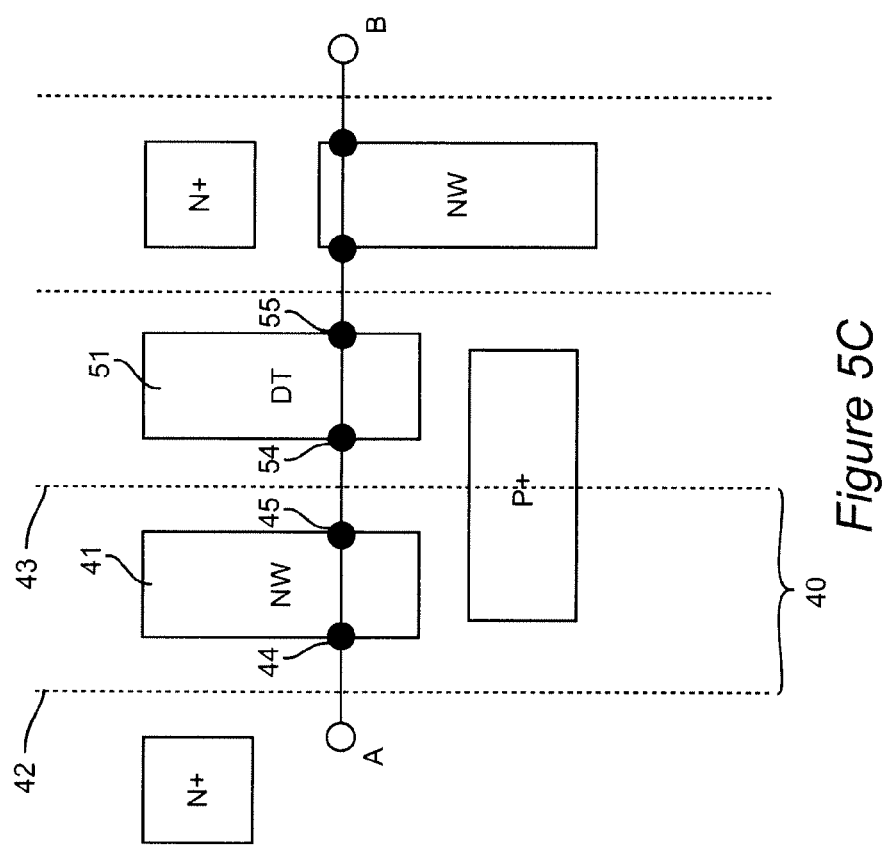

In a second alternative, depicted in FIG. 5c, the domains are defined according to a bisector between two intersection points along the arc, the intersection points being located either on adjacent shapes or at points A or B of arc AB. For example, in FIG. 5C, N-well 41 contains intersection points 44 and 45, and deep trench 51 contains intersection points 54 and 55. The section of arc AB that is between intersection points 45 and 54 is bisected by dashed line 43. Dashed line 43 is used to define a plane normal to the substrate surface and perpendicular to the direction of arc AB, and delimits the right side of domain 40. The left side of domain 40 is delimited by dashed line 42, which bisects a section of arc AB between point A of the arc and intersection point 44 of N well 41.

According to the present invention, domains or regions may be defined by either process. However, if the second (bisector) method of defining domains is utilized, the physical impedance mismatch at the shape boundary cannot be determined. For this reason, the bisector method of defining domains may be chiefly advantageous when electron transmission across a domain is to be determined experimentally. The methods of the present invention can be carried out in the same manner whether or not the distances between shapes are represented as equal (as in FIGS. 5A and B) or not, i.e. distances between shapes can be variable.

In the case where the domain is defined according to the actual interface (i.e. the first method described above), the "boundary condition" can be defined at that interface to determine the mismatch in the transmission, reflection and absorption (recombination) at that interface. In this fashion, the mismatch at that boundary can be evaluated as a "generalized impedance match" and the equations associated with the transmission factors can be used. Domains may be defined within any region of interest. For example, a region in which material properties change across the region (e.g. a gradient) can be subdivided into multiple domains, each of which may be analyzed by the methods of the present invention.

As noted above, if the second (bisector) method of defining domains is utilized, the physical impedance mismatch at the shape boundary is not determined. Rather, in this method, electron transmission across a domain is determined experimentally.

The domains that are defined during the practice of the present invention will each have unique properties with respect to the probability of electron transmission through the domain. The probability of transmission (e.g. as well as the probability of reflection, and the probability of absorption) will be influenced by the type of structure that is contained within the domain, (n-well, deep trench, etc.) and domains containing the same type of structure will vary according to factors such as the dimensions of the structure, the composition of the structure, temperature, material composition (e.g. thermal and electrical parameters), etc. Each domain may be viewed as a region where electrons entering the domain are the current in, and the electrons flowing out of the domain are the transmitted electrons. The transmission of electrons from point A to point B across several domains is thus amenable to analysis by two-port matrix algebra. By defining a matrix approach, transmission factors can be defined for each domain of different type (n-well, deep trench, etc.). Each transmission factor represents the characteristics of the medium between the two planes that define a domain. In this fashion, the transmitted electrons may be represented as an output vector (or value), which is equal to the forward transmission matrix times the input vector of electron current. Note that the order of the matrix can be of higher order when addressing multiple directions of current flow. For example, the matrices can be higher order tensors addressing more directional information. In a complex semiconductor chip, the electrons moving through the substrate in a diffusion or drift process along an arc AB (e.g. note: the diffusion is a set of random paths between A and B) as described in the present invention, will traverse different domains. For example, there may be "N" number of different domains between the point of injection of electrons at point A and collection of electrons at point B. An overall transmission matrix that takes into account transmission from point A to point B is the product of the individual matrices of the different domains between points A and B. In this fashion, the number of electrons that reach point B can be evaluated taking into account the regions that collect electrons, reflect them, or allow for recombination along that physical distance. As a result, the quantification of the transmission factors for each type of region (e.g. deep trench (DT), n-well, n-diffusion, and p+ substrate contact) will allow a characteristic matrix or characteristic impedance to be defined allowing for the calculation of net electron transport.

Figure 7:
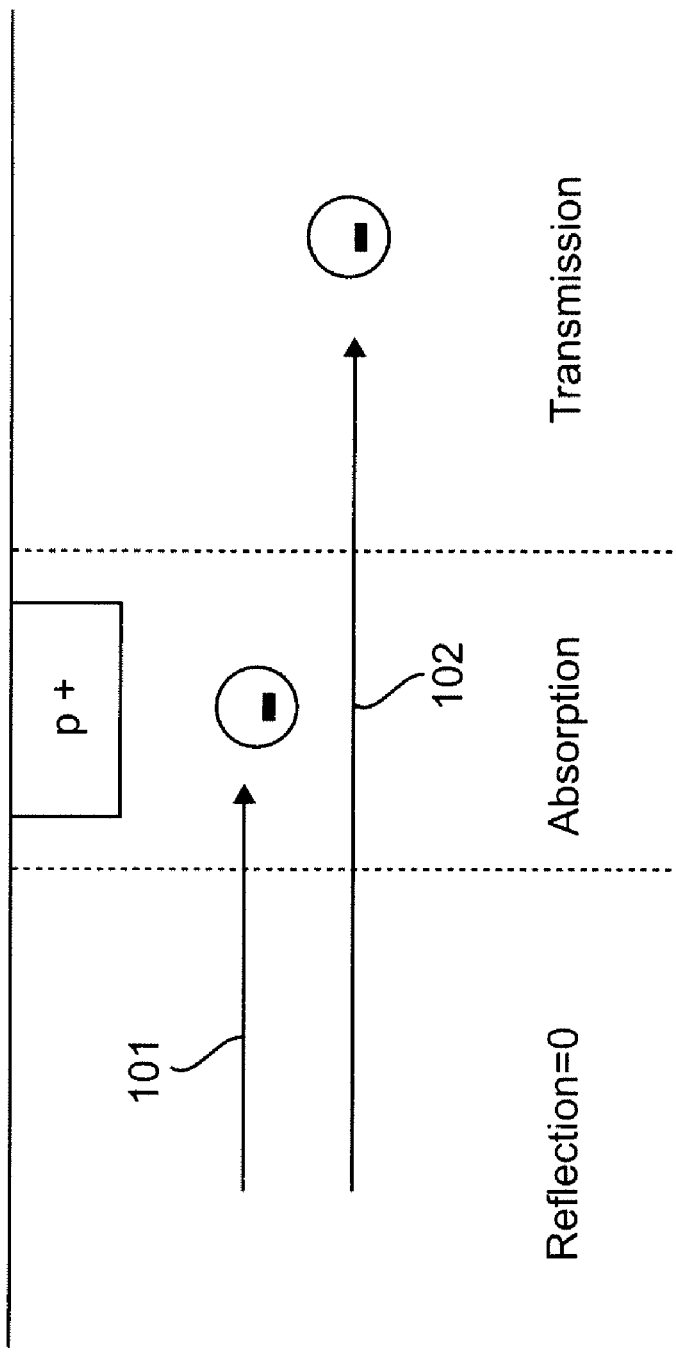
FIG. 7 illustrates a domain containing a p+ well/p−substrate.
Figure 8:
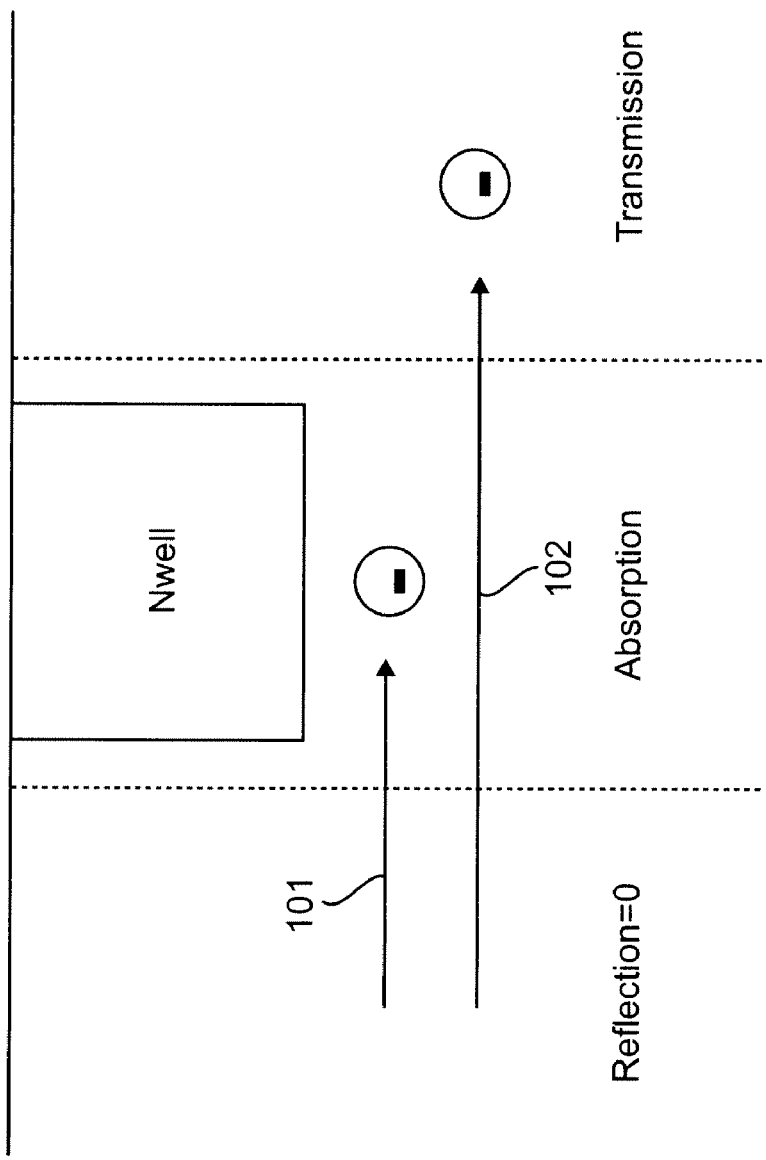
FIG. 8 illustrates a domain containing an n-well.

By defining the physical space into a set of domains as described herein, the characteristics of reflection, transmission and absorption operate as if the physical space (i.e. the path or trajectory) traversed by the electrons is a "stratified media" of N domains. From a matrix perspective, a forward transmission matrix allows the calculation of the transport from any point A to point B along the trajectory. An individual probability that an electron will traverse a given domain can be calculated for each individual domain along the path, and the total transmission probability (probability that the electron will travel from A to B) is the product of the individual probabilities across each domain. The quantification of the probability of crossing an individual domain is dependent on either experimental measurements using test structures, or by analytical knowledge of recombination and diffusion lengths. Both of these methods of quantification are well-known to those of skill in the art. FIGS. 6, 7 and 8 illustrate the quantification of the probability of electron transmission across three different types of domains.

Figure 6A:
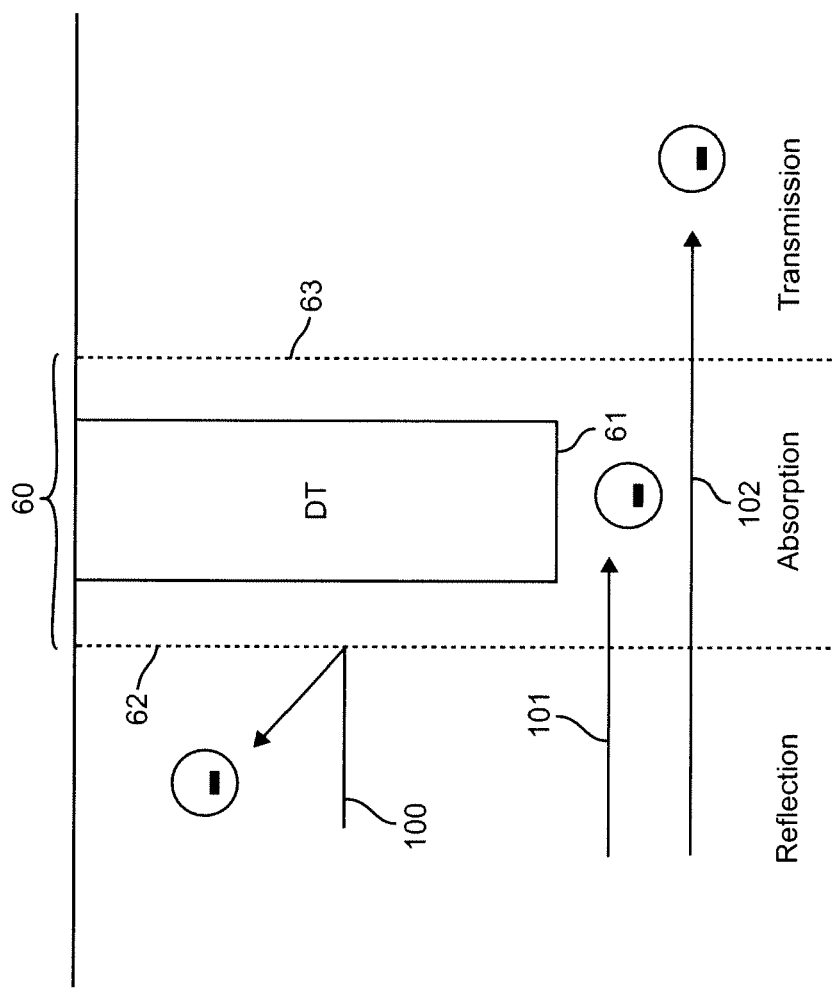
Figure 6B:
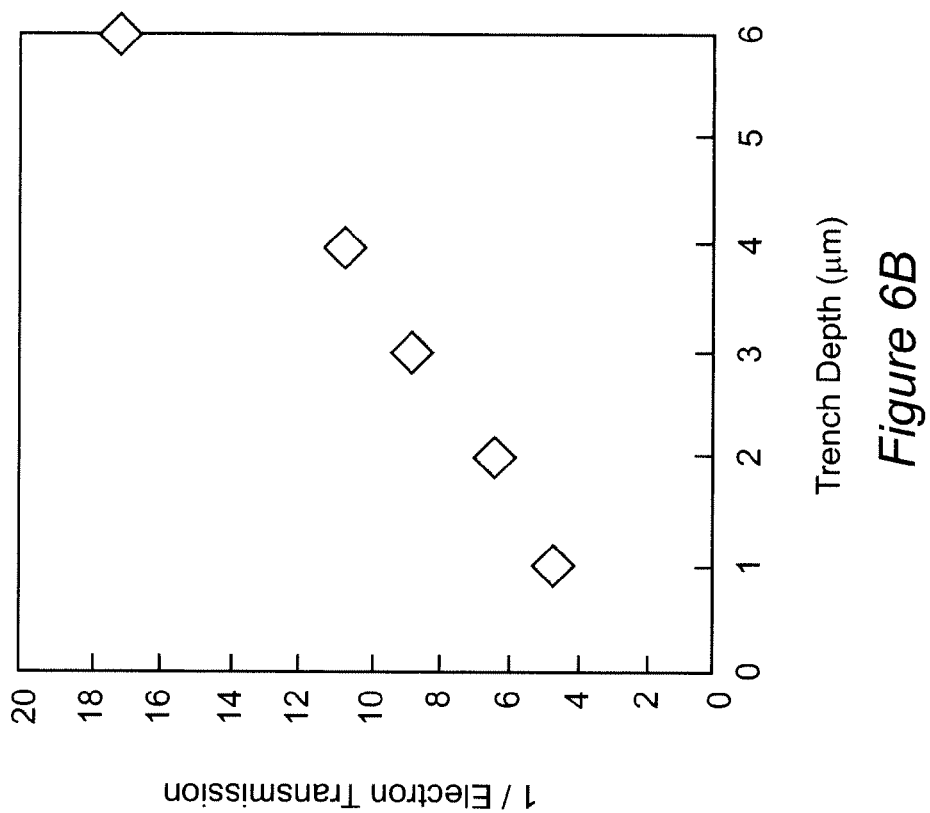

FIG. 6a illustrates the method of the present invention where a domain 60 encompassing deep trench 61 has been defined by bisector lines 62 and 63. The adjacent shapes are not shown. FIG. 6a shows a schematic representation of a deep trench (DT) structure where electrons can be reflected (illustrated by arrow 100), absorbed by (illustrated by arrow 107) or transmitted through (illustrated by arrow 102) the domain. Reflection may occur at both sides of the deep trench (DT) boundary, and the measured reflection is the combined effect of reflection at both deep trench (DT) boundaries. Experimental measurements, the results of which are given in FIG. 6b, show that the probability of the transmission around the trench structure is linear with trench depth. FIG. 6c illustrates a two-port matrix in which T11, T12, T21 and T22 represent the four matrix components.

FIG. 7 illustrates a domain defined according to the methods of the present invention that encompasses a p+ contact. In a p+ region, the carrier may either recombines in the physical width (is absorbed, illustrated by arrow 101) or is transmitted across this region (illustrated by arrow 102), i.e. reflection of the carrier is not possible. The probability of transmission is easily quantified because the probability of recombining in the distance is associated with the width of the region normalized to the diffusion length.

Minority carriers will diffuse since $$D = \mu kT/q$$

and $$L = (D_T)^{1/2}$$

Note that the diffusion properties are based on the doping concentration in the substrate, and on the temperature. The recombination rate is a function of the Shockley-Hall-Read recombination (proportional to the inverse of the substrate doping concentration at low dopings), or the Auger recombination (proportional to the inverse of the square of the substrate doping concentration at high dopings).

FIG. 8 illustrates a domain defined according to the methods of the present invention that encompasses an N well (e.g., n-well or N-well). In the case of an n-well region, electron reflection is not possible. Rather, electrons are typically collected at the junction between the substrate and the n-well, and n-well regions tend to absorb electrons (illustrated by arrow 101), preventing their transmission through the domain. The collection efficiency of an n-well region is a function of the width and depth of the n-well, and the substrate doping profile and concentration. Collection efficiency is never 100% so some electrons will be transmitted (illustrated by arrow 102). The probability of electron transmission across an n-well domain can be quantified analytically, experimentally, or through device simulation.

Figure 9:
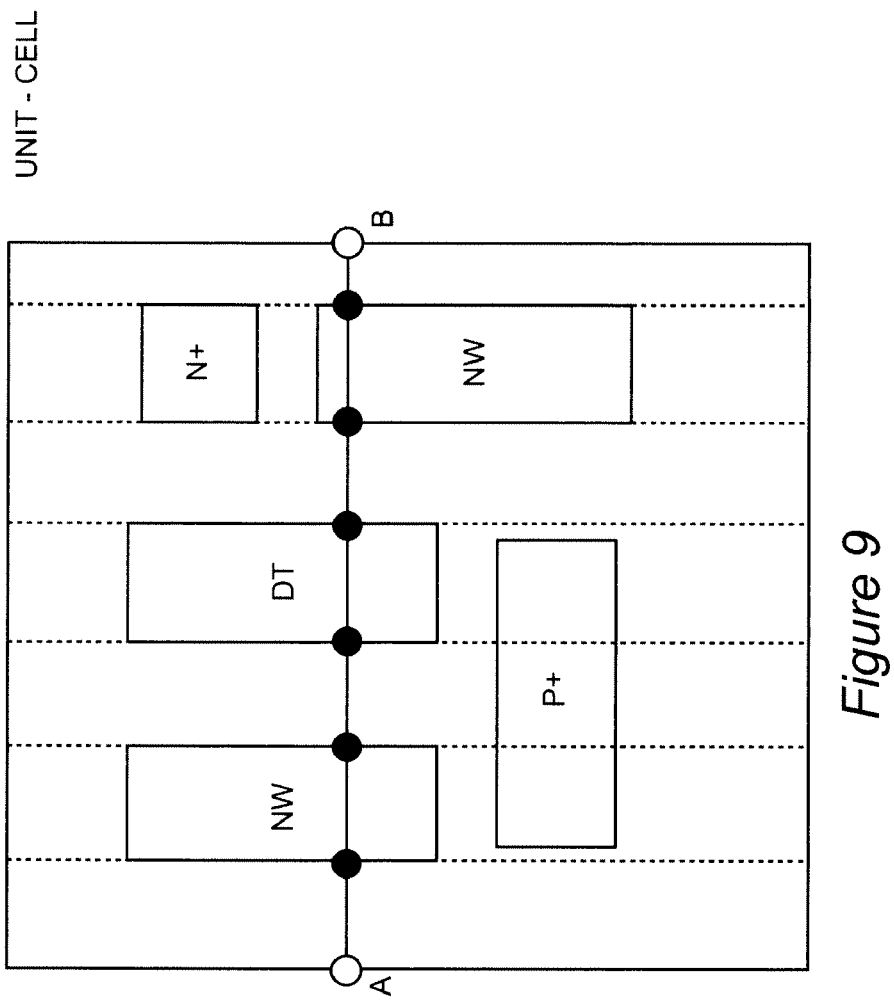
FIG. 9 depicts a unit cell.

FIG. 9 illustrates a preferred embodiment of the invention to quantify the transmission probability for a functional block. A functional circuit block or region (e.g. the unit cell depicted in FIG. 9) can pre-quantify the transmission through the physical region. For example, prior to the arc definition, each physical functional block can quantify its electron transmission matrix. For example, the method can define the functional block dimensions in a first and second dimension (x and y directions). The BEOL shapes, and poly shapes are eliminated and only shapes that affect the electron transport in the silicon are kept as in the prior method. An arc is defined through the functional block and the transmission from one side of the functional block to another is quantified at all points in the x=constant and for all points where y=constant. In this fashion, the transmission probability across a functional block is pre-calculated for a given semiconductor functional block design, referred to as a parameterized or P-cell.

Figure 10:
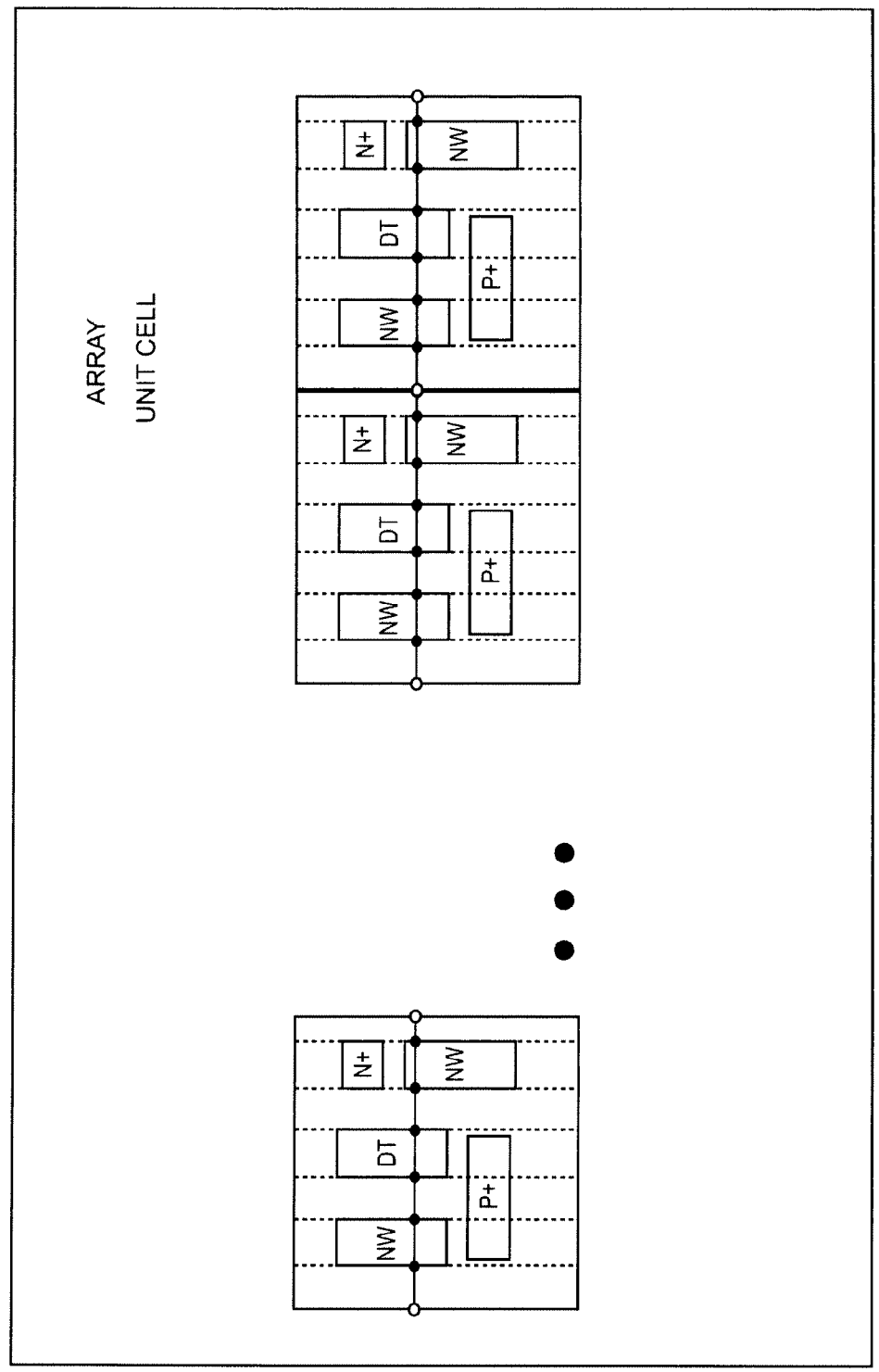
FIG. 10 depicts a functional block with a repeated periodicity (array) of circuit "unit cells"

Many microchip designs include repeats of many identical unit cells across the chip, e.g. a periodic array of many identical unit cells (e.g. SRAM or DRAM) as is illustrated in FIG. 10. The methods of the present invention can be effectively applied to such a system. FIG. 10 illustrates a functional block with a repeated periodicity of circuit "unit cells" according to the teachings of the present invention. Where there exists a periodicity or a "unit cell", the transmission matrix of a given unit cell can be predetermined. This unit cell can be a static random access memory (SRAM) cell, a dynamic random access memory (DRAM) cell, a "gate-array" book, a interface circuit book, an off-chip driver (OCD) book, a logic book or the like. In this fashion, the unit cell transmission matrix is defined by defining the x-y perimeter, defining a line through the region, and dividing the region into physical domains as the arc intersects the transition domains. The transmission matrix is then obtained for the unit cell as the product of the transmission factors or transmission probabilities for all domains, producing a single, combined probability value for the group of domains. This type of calculation can be carried out for other types of spatially distributed structures as well, (e.g. domains across a gradient region), where a combined value might also be useful.

Figure 11:
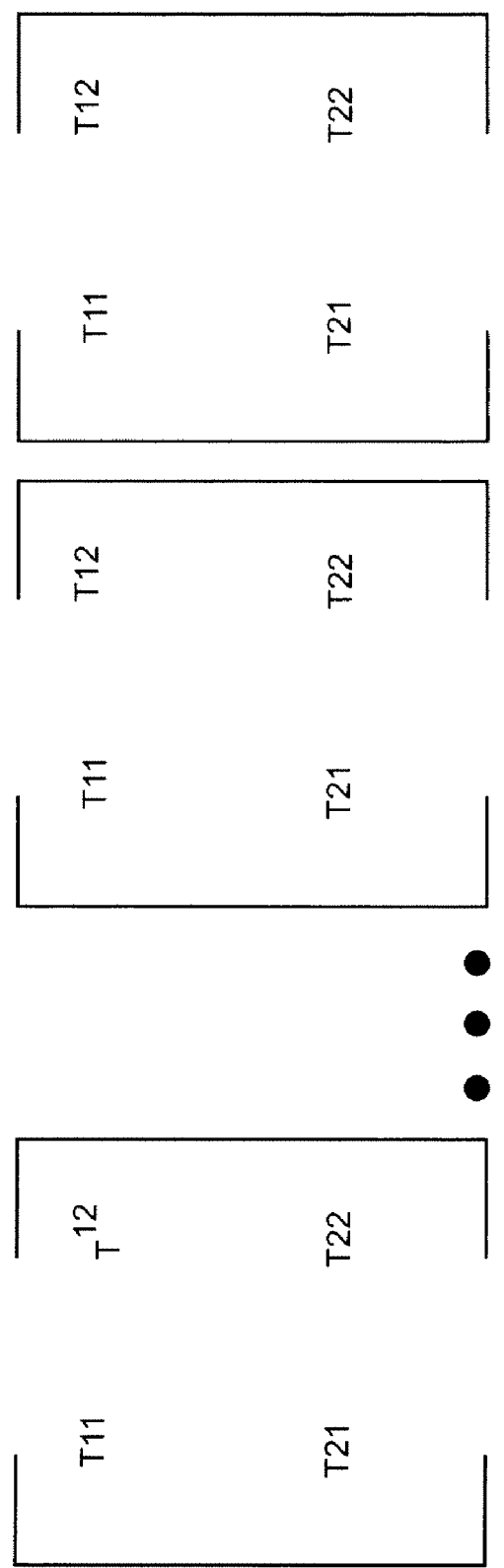
FIG. 11 depicts a matrix representation of electron transmission for a unit cell array.

The significant advantage of this method is that in the case of a large chip region with identical unit cells (e.g. SRAM or DRAM) the total transmission matrix (FIG. 11) is the product of the transmission matrix of a unit cell to the power of the number of cells. Mathematical identities, and relationships exist to quickly obtain these solutions with no additional work or matrix algebra. As a result, the transmission probabilities for latchup injection or noise injection for large periodic regions can be quickly calculated.

In these methodologies, the transmission factors can be pre-processed based on a given SRAM cell, and periodicity prior to higher-level evaluation. In a chip design there are DRAM arrays, SRAM arrays, decoupling capacitors, off-chip driver (OCD) banks, receiver banks, ESD input networks, ESD power clamps, analog circuitry, gate array logic regions, custom logic, voltage islands, wiring bays, fill shapes and other circuit function. As a result, the electron transmission probability can be mapped for each type of region prior to analysis of the arc across these regions. For example, in an ASIC environment, all the transmission factors can be pre-calculated for every developed design book.

Additionally if the arc of interest ends in the periodic functional block, the matrix is easily calculated at any point in the functional block as well as the total value when traversing the entire block.

Figure 12:
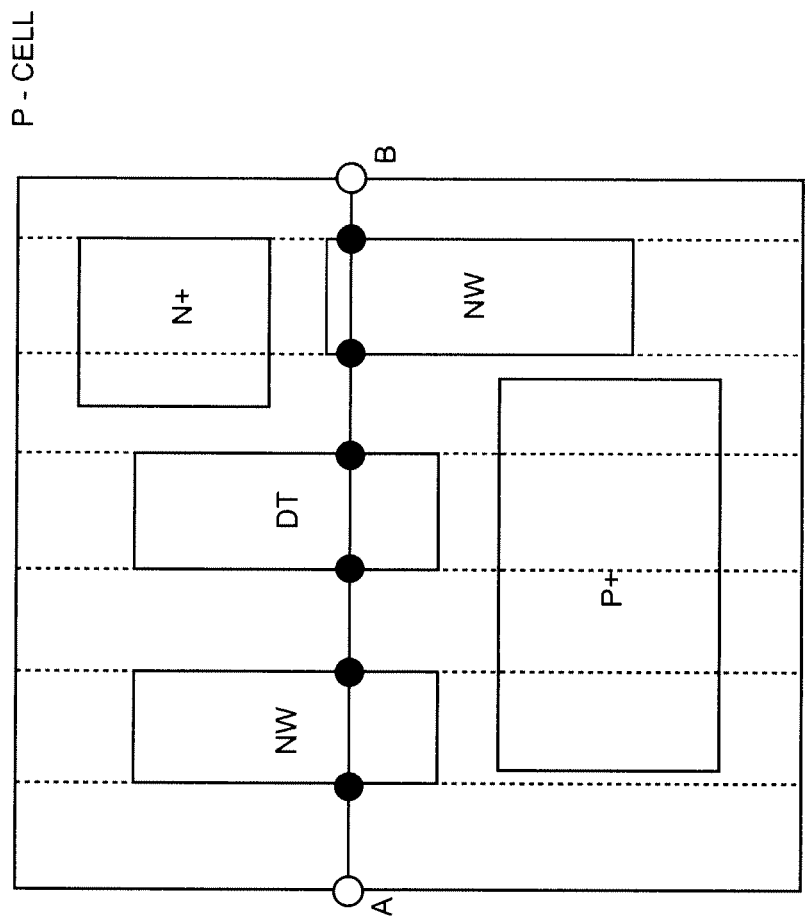
FIG. 12 represents a unit cell that is a parametrized programmable "p" cell (e.g. p-cell, P-cell or Pcell).

In a preferred embodiment of the invention, the transmission probability is quantified for a "unit cell" where the unit cell is a parameterized programmable cell (Pcell) according to the teachings of the present invention (FIG. 12).

Another embodiment is given a design that uses a P cell (e.g. p-cell, Pcell, or P-cell) implementation, the electron transmission matrix can be evaluated for each P-cell prior to designing of the chip. The parameterized cells, known as p-cells, were constructed in a CADENCE™ design system. The p-cells are grow-able elements that fix some variables, and pass some variables to the higher order circuit through inheritance. P-cells consist of "primitive" elements that contain "cell-views" in a library of elements. These p-cells can be a resistor, a MOSFET, a diode, a capacitor, an input pad, or any electrical or physical construction used in semiconductor chip design. The "cell-view" can consist of a design layout, an electrical circuit schematic, and a symbol function. From base p-cells, circuits are constructed which can also become a hierarchical higher-order p-cell containing both graphical and schematic function. In these categories, there exists both the CMOS-based and the BiCMOS SiGe-based implementations. From the primitive p-cells, hierarchical parameterized cells can be developed. The hierarchical p-cells also contain the graphical, schematic and symbolic function. The P-cell is driven by software and SKILL code. The p-cell can contain any information that is useful to the customer. Hence, the transmission, reflection and absorption properties can be stored in the parameterized cell for calculations. The advantage of this method, as in the ASIC method, is the calculations that are carried out by the practice of the present invention can be pre-stored and contained in the P-cell and hierarchical P-cell prior to the chip design process. It can be contained in the library element deliverables prior to the calculation of the noise or latchup evaluation process. The P-cell design system was developed to allow for change of circuit topology as well as structure size in an automated fashion. Layout and circuit schematics are auto-generated with the user varying the number of elements in the circuit. The circuit topology automation allows for the customer to autogenerate new circuits without additional design work. Interconnects and wiring between the circuit elements are also autogenerated.

Figure 13:
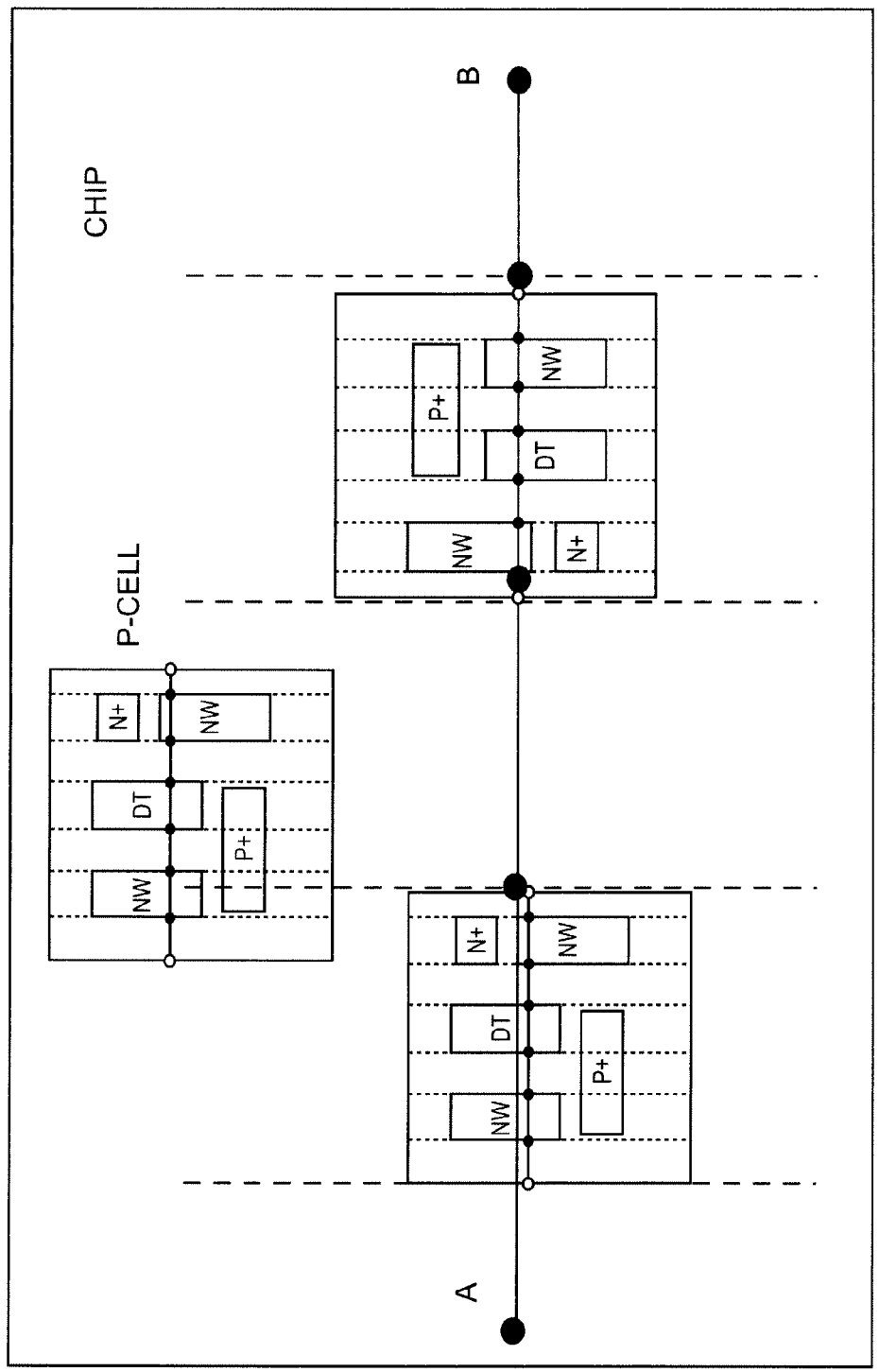
FIG. 13 represents p-cells arranged on a chip.

The P-cell transmission matrix may be coded into the design based on the P-cell design parameters and stored in the P-cell for each library element. In this case, the method would first evaluate the P-cell electron transmission process. In this process, the evaluation of the transmission factors can be achieved analytically, experimentally, or theoretically. In the P-cell are certain "inherited variables" and user variables that allow the changes of the size of the P-cell. The evaluation of the transmission factors must be evaluated as a function of the user variables and placed in either analytical equations, look-up tables, or other data storage forms. This would be contained within the translation box of the P-cell and the information would be called up when the P-cell was exercised. Two methods of the P-cell are possible through the graphical method or driven by software, known as SKILL code. Once the data table is stored in the P-cell, the information can be stored in the SKILL code. Hence, to evaluate the transmission, the P-cell would be first identified. This then draws the information via SKILL code or is done based on domain definitions as described in the earlier methods. In this case, removal processes of extra shapes can be eliminated and/or ignored in the methodology. Fore example, the BEOL shapes are not eliminated except for interconnects which are not connected to the P-cells. These are ignored and only information stored in P-cells may be utilized. The method is illustrated in FIG. 13, and includes the steps of evaluating the P-cell transmission matrix, placing all the P-cells in the design, defining and arc between a point A and a point B, and then evaluation of only P-cells that are intersected by the arc, and defining domains for the regions between the P-cells. In this fashion, the transmission factor is the product of the P-cells and the adjacent domains between the P-cells.

Figure 14:
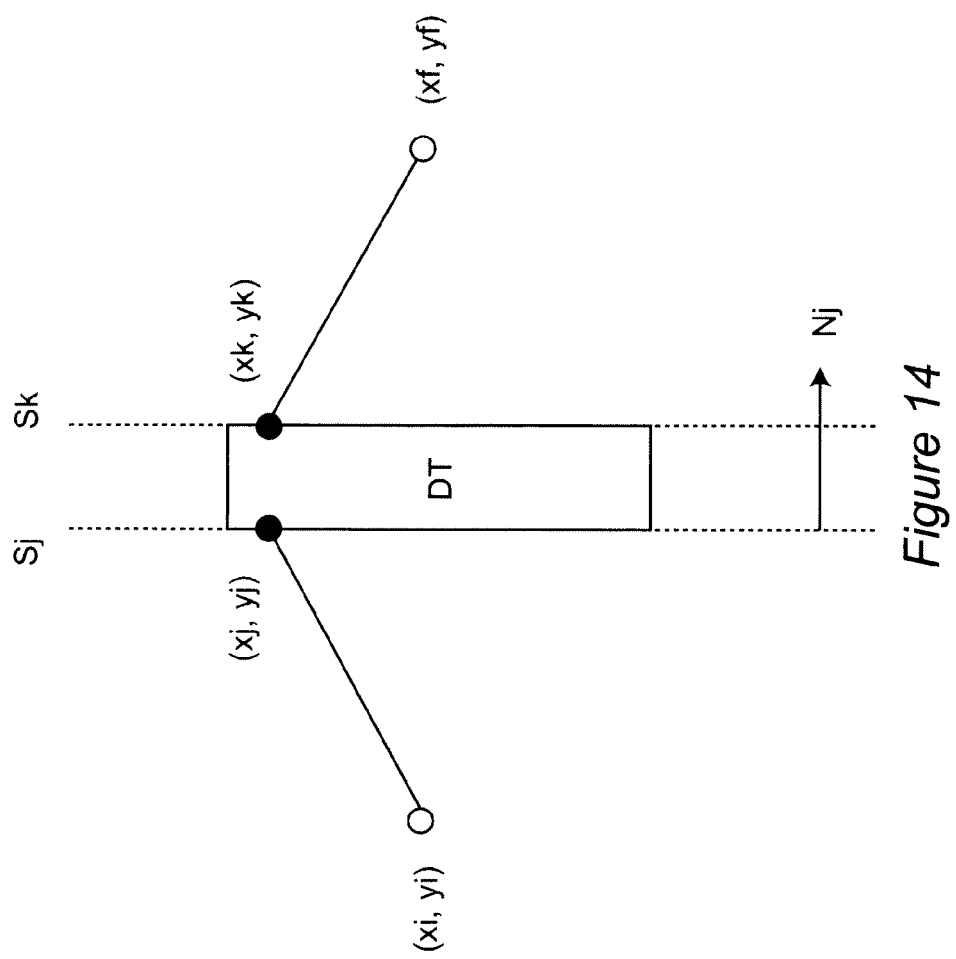
FIG. 14 illustrates an analytical method for a two dimensional region.

FIG. 14 is an additional embodiment that addresses an analytical method for two-dimensional regions. To address the probability factor from a initial point $(x_i,y_i;)$ to a final point $(x_f,y_f)$ in a two-dimensional plane, it is possible to sum the transmission probability starting at a initial point $(x_i, y_i)$ to a dummy point $(x_j, y_j;)$ and the transmission probability from the dummy point, to final point $(x_f, y_f)$.

The probability that a carrier is admitted at point $(x_i,y_i)$ arrives at a point $(x_f,y_f)$ given that it passes through intermediate point $x_j,y_j$ can be expressed as the product of the conditional probability of arriving at point $(x_f,y_f)$ given that it went through point $(x_j, y_j)$ times the conditional probability that given that it arrives at point $(x_j, y_j)$ given it was released at point $(x_i, y_i)$ $$P(x_f,y_f)=P(x_f,y_f|x_j,y_j)P(x_j,y_j|x_i,y_i)P(x_i,y_i)$$

Hence the total probability is the sum of all the probabilities summed over all possible points j between point i and point f. This can be expressed as $$T(x_f,y_f)=\Sigma T(x_f,y_f|x_j,y_j)T(x_j,y_j|x_i,y_i)$$

In this fashion, a locus of points is chosen in incremental distances by along a surface where the intermediate points are along an interface where the interface extends over a distance of interest. The total transmission can be obtained from the summation of points along the interface $$T(x_f,y_f)=\Sigma T(x_f,y_f|x_j,y_j)T(x_j,y_j|x_i,y_i)\delta y$$

The total transmission can be obtained from the summation of points along the interface. This can be also expressed as an integral along the incremental regions in the y-dimension. As an example, a shape of a trench structure exists in a region of definition between a first surface $x=x_1$ and $x=x_2$, and infinite in the y-dimension. Hence the total transmission from a first point to a final point can be evaluated as the probability that an electron emitted at the initial point survives (transmitted) to all points along the surface $x=x_1$ at point y1 times the probability that it leaves point x1, y1 and is transmitted to point xf,yf. The total transmission probability is the summation of all points $x=x_1,y_1$ where the integration is completed over all points y1 from minus infinity to infinity. In the case that the domain is not infinity, but finite the transmission can be evaluated over the width of the trench structure in the y-dimension.

As the dimension approaches large distances, the additional transmission probability will rapidly decrease in the contribution of the sum. As the intermediate points approach the diffusion length, the probability of survival approaches zero. Hence the contributions from all points xj, yj along the surface which are greater than a diffusion length from the initial point will have a low value of contribution. Additionally, as the distance between all points xj, yj is significantly greater than the diffusion length from point xf, yf, the probability of survival is also low. As a result, the net contribution from distant points will not contribute, and the integration can be estimated or truncated to simplify the analysis. Additionally, for mathematical simplicity, the integration may be carried to infinity since the additional contribution will be negligible at some physical distance.

A second embodiment takes into account a first surface and a second surface where the first surface is the set of points j (xj,yj) and the second surface is the set of points (xk,yk). The point on the jth surface provides a normal vector Nj, to the surface where the set of points k on the second surface are along the same normal vector Nj but displaced by the material change between the surface Sj and Sk. In this fashion, the transmission probability is expressible as the transmission from the initial point i to the point j on the surface Sj times the transmission probability from the surface Sj at point j to the surface Sk to the point k where the point k is along the normal vector Nj at point k times the transmission probability from point k to the final point point (xf, yf).

$$T(x_f,y_f) = T(x_f,y_f|x_k,y_k) T(x_k,y_k|x_j,y_j) T(x_j,y_j|x_i,y_i)$$

To obtain the total transmission probability, summation or integration is completed over the surface for all points xj,yj on surface Sj.

$$T(x_f,y_f) = T(x_f,y_f|x_k,y_k) T(x_k,y_k|x_j,y_j) T(x_j,y_j|x_i,y_i) dSj$$

The method can also include integration over the surface Sk.

When the material property between j and k are the same material, the transmission probability will be a function of the material between. If the region is not the same between the two surfaces for all points j then the region can be analyzed as a set of independent integrations over the individual regions. For example, in some regions there may be n diffusions, and the other trenches. As a result, the transmission probability will not be equal between the two physical domains. The analysis of the total probability can also be analyzed using test structures and electrical measurements to verify the accuracy of the analytical model.

This method can be generalized to a non-Euclidean domain and can also be addressed in the cylindrical and spherical coordinate systems. Again, the analysis is from an initial point to a point on the cylinder, and from the cylinder to a second final point. The probability of transmission is then the product of the conditional probability of the transmission from the final point from a point on the cylindrical region times the transmission from the point on the cylinder given from a first point. The total transmission is evaluated by summation or integration of all intermediate points along the surface.

For analysis of noise injection, the method of the design system calculates the total transmission probability given it is initiated at a first point and arrives at a second point. The total injected carriers is the product of the total transmission probability and the magnitude of the injected current.

FIG. 15 is a flow chart representing the evaluation of transmission probability according to the methods of the present invention. The steps shown are: defining a first initial point and a final point (e.g. tracing an arc from a point A to a point B); eliminating all BEOL shapes; establishing surfaces (e.g. establishing domains between normal planes); evaluating transmission probability of regions (domains); and evaluating total transmission probability (calculating the total transmission probability across all domains traversed by arc AB.

Figure 15A:
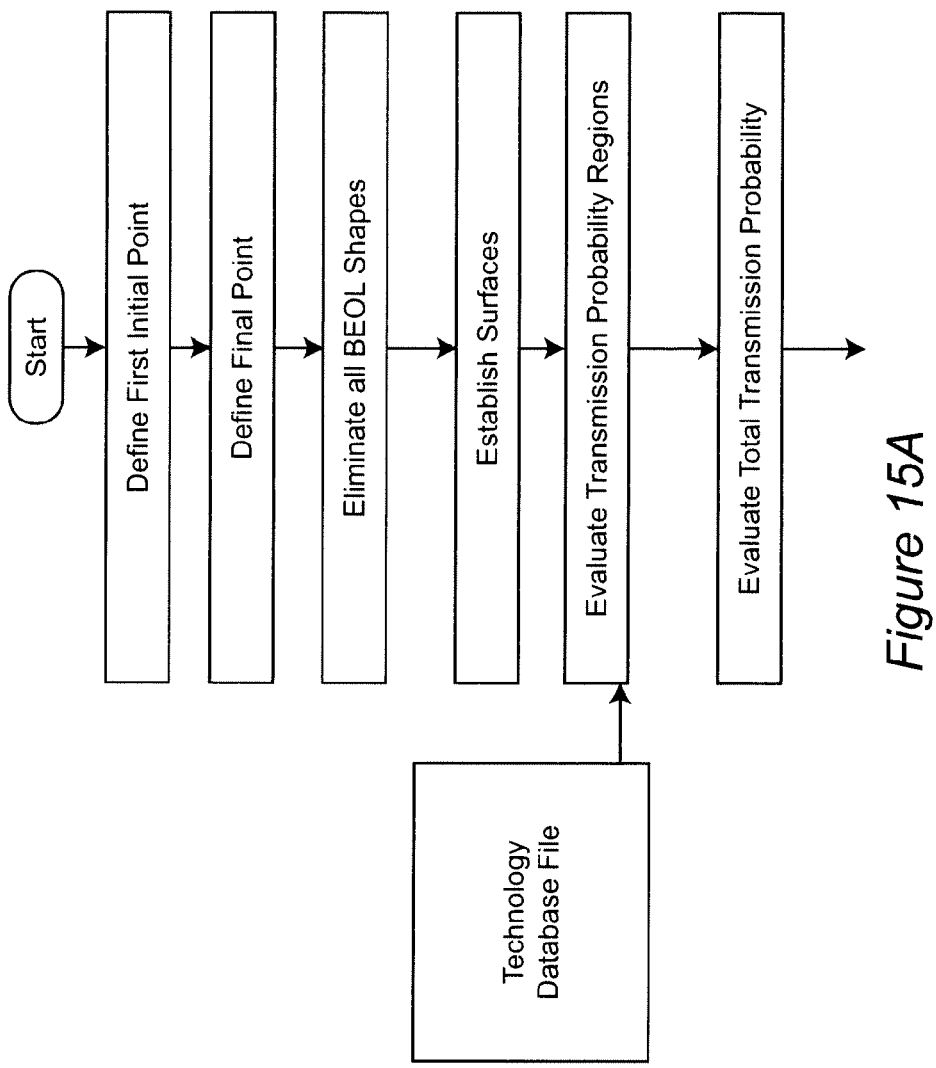
FIGS. 15A–D are flow charts representing evaluation of: A, transmission probability; B, latchup using parasitic circuit models; C, latchup using an analytical model; and D, latchup using a second analytical model.
Figure 15B:
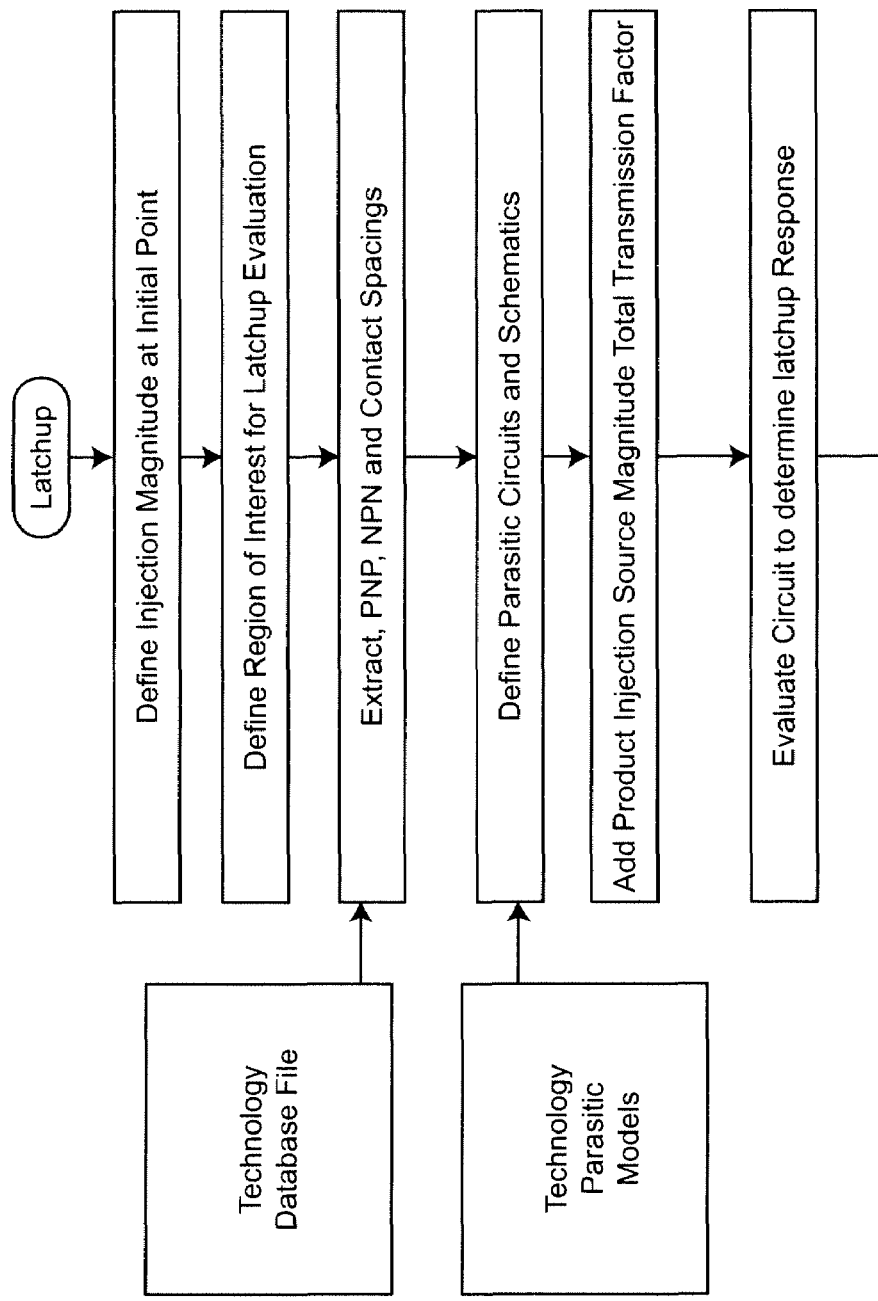

FIG. 15b is a flow chart of the steps of a latchup analysis method using parasitic circuit models and incorporating the above methods of analysis. The latchup analysis tool will typically consist of 1) an injection source 2) at least one circuit or plurality of circuits
3) a technology data file
4) a circuit schematic and logical-to-physical tool; and
5) a parasitic schematic generator.

In one embodiment, the methodology would first incorporate evaluation of the injection regions. A single or a plurality of injection sources must be evaluated as the points of injection. The tool must evaluate the region of interest of at least one sensitive circuit where latchup will be evaluated. This establishes the region of injection, and evaluates the region of interest. All shapes in between the regions of interest can be compressed for evaluation of the transmission probability between the injection region and the circuits where latchup will be evaluated. A first initial point and final point are established. The shapes of interest between the two regions of interest are reduced for evaluation of the transmission. At the region of the sensitive circuits, the shapes must be maintained to evaluate the impact of the transmitted carriers on the sensitive circuits. Hence a region defining the sensitive circuits must be defined. The transmission probability is established by the product of the transmission factors between the first point and the region of the sensitive circuit.

At the region of the physical circuit, latchup parameters and the generalized differential tetrode criteria is evaluated to determine whether the circuit undergoes latchup from the external source. Using a logical-to-physical checker, and the parasitic generator, the parasitic silicon controlled rectifier is identified. The parasitic SCR strength is determined by the following variables:

1) Bipolar Current gain of the parasitic pnp
2) Bipolar Current gain of the parasitic npn
3) Substrate resistance (P+ contact to npn space)
4) Well resistance (N-well contact to pnp space), and
5) Emitter resistances of the npn and pnp structures.

To obtain the bipolar parasitic pnp and npn gains, the technology data file which contains the vertical profiles is used. The technology data file can contain parasitic circuit models for the parasitic structure in some cases. In the case that there is no complete circuit model, knowledge of the parasitic spatial parameters and gain terms will be adequate to evaluate the generalized differential tetrode condition to verify if latchup will or can occur. The spacing of the well and substrate contacts determines the space for evaluation of the resistances. The technology data file also will contain the substrate and well doping concentration and sheet resistance for evaluation. Emitter resistances of the parasitic npn can also be extracted from the spatial distance in conjunction with the technology data files.

Evaluation of the occurrence of latchup can then be evaluated using a circuit generator which generates the SCR network with the emitter and shunt resistances, and includes the current transmitted from the substrate. The transmitted current term is equal to the transmission probability times the injected current. For the circuit analysis, a time retardation can be used to address the time response as well as the magnitude. The diffusion retardation time response is a function of the distance from the injection source.

Figure 15C:
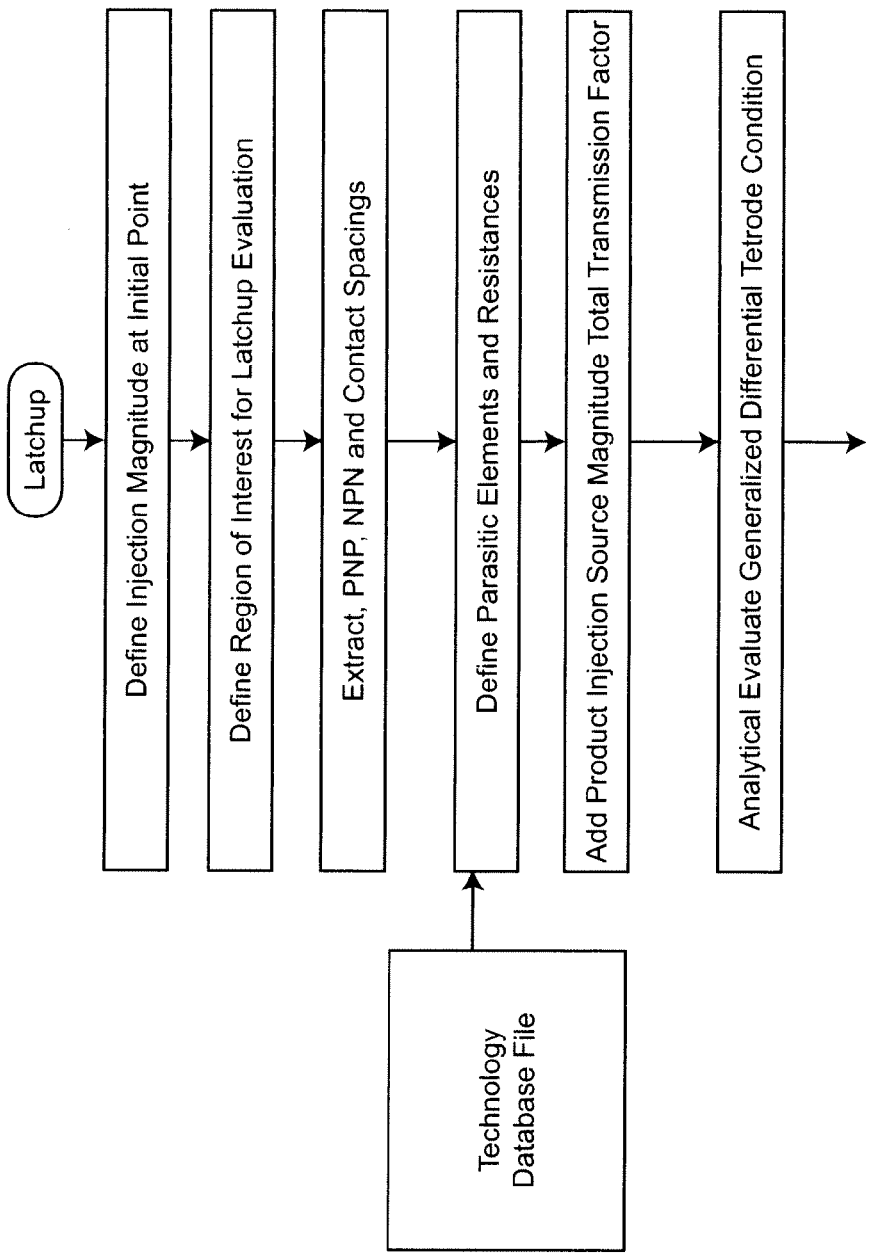

For an analytical evaluation, such as that illustrated by the flow chart of FIG. 15c, latchup can be evaluated from evaluation of the generalized differential tetrode condition for the initiation of latchup. The aforementioned discussion addresses the case of a single SCR pnpn tetrode for the region of interest with an external injection source.

A computer aided design structure would typically consist of:
- a graphical generator;
- a schematic generator;
- a technology data file source;
- a parasitic element identifier; and
- a latchup criteria discriminator.

Given the region of interest is a plurality of circuits, the latchup evaluation can incorporate a plurality of pnpn structures. The extraction tool and LVS system can evaluate the location of all pnp and npn transistors and the physical location of the physical contacts. A graph theory model which identifies the coupling of the pnp and npn can be used to evaluate the inter-coupling of the adjacent elements. In this process, the propagation of the latchup within the circuit block can be evaluated using the generalized differential tetrode relationship as discusssed above. In the case of the coupled pnpn latchup problem, the primary injection from the first injection source must be added to the secondary injection. The primary injection is obtained from the transmission probability analysis. The secondary emission is associated with the injections within the local circuit region where latchup is propagating in a "domino" type effect.

Figure 15D:
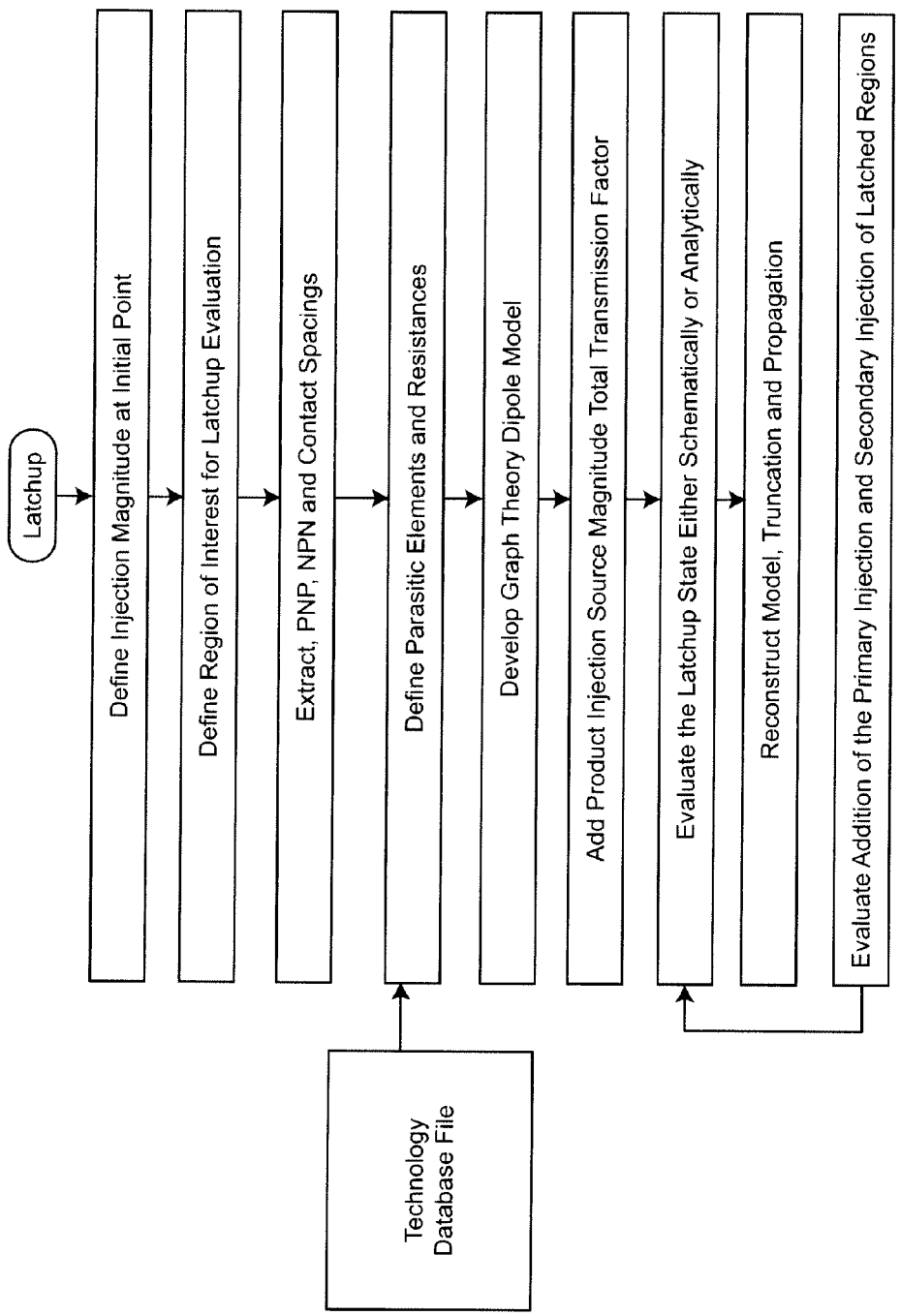

A graphical means to automatically or manually (or combination thereof) generate a representation of the latchup circuit implicated in latchup given an injector source, or combination of sources is illustrated by the flow chart of FIG. 15d. It takes technology inputs, model inputs, and injector inputs, with the physical (and, if appropriate, the schematic view or other circuit views) to generate this representation. The parasitic elements important to potential latchup are identified, and the relationships between the devices are represented within the graph. As such, the graph is a representation of the elements that contribute to latchup and may be considered as an additional view of the design within a design system. Once identified, the resultant view and associated netlist may be analyzed for latchup exposure, and the representation may be further optimized and tuned to improve latchup tolerance. Tuning may be at the physical and/or electrical levels. Tuning may or may not disturb the topology of the representation, and the invention includes hierarchical representation and analysis.

A graphical representation is a pair of nodes and a connector. This structure is referred to as a "dipole". The nodes of this simplest graph are the n+ and the p+ diffusions, respectively. The connector, or edge, is the silicon controlled rectifier (SCR), or pnpn structure. While the pnpn structure, or SCR, is well known in the literature it is the representation of a set of dipoles connected together in connected "runs" or interconnected runs connected in networks where this patent has utility as a structure and method that may be automated and used to understand and solve latchup for the complex structures that occur in realistic ICs. In a preferred embodiment, edges connect opposing "polarity" nodes. ie: p+ and n+ nodes alternate within a run. Whether diffusions may be connected depends upon the strength of the potential connector, which is determined by the technology and geometric factors including beta product, well and substrate resistances, proximity to the injector or trigger of latchup. In addition to the injector itself, latchup may be triggered by a neighboring collector able to upset the potential at the base of one of the npn or pnp pairs of the SCR in question. As such, a domino effect can be triggered across the extent of the run or network.

A computer aided design structure typically includes elements such as: a graph theory generator of parasitic pnpn elements; a current generator of secondary currents initiated by elements that undergo latchup; a primary current and secondary currents summing structure; a tree propagation generator; and a latchup propagation evaluator.

In the event that the injection source is a electrostatic discharge (ESD) event, or a cable discharge event (CDE), the initial current waveform can be different, influencing the time response. The retardation time is the lag time between the injection and when the waveform is established in the region of interest.

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

What is claimed is:

1. A method for evaluating minority carrier transmission in a semiconductor chip design, comprising the steps of:
   forming said semiconductor chip design using shapes;
   defining an arc between a first point and a second point in said semiconductor chip design, wherein said arc crosses at least one of said shapes;
   quantifying absorption, reflection and transmission characteristics of each domain along said arc;
   evaluating total minority carrier transmission from said first point to aid second point across said domains using said quantified characteristics; and
   determining latchup or noise or defect in said semiconductor chip design based on results of said evaluating step.

2. The method of claim 1, wherein each of said domains is delimited by two normal planes.

3. The method of claim 2, wherein each of said two normal planes includes a point co-located on said arc and on a perimeter of a shape.

4. The method of claim 2, wherein each of said two normal planes includes a bisector of a section of said arc, wherein said section is located between two adjacent points.

5. The method of claim 1, further comprising a step of removing shapes that are not in a substrate prior to said step of defining said arc.

6. The method of claim 1, further comprising a step of removing shapes within a well tub of a second doping polarity prior to said step of defining said arc.

7. The method of claim 1, further comprising a step of calculating electron current collected at said second point.

8. The method of claim 1, wherein said first point and said second point lie on a boundary of a circuit.

9. The method of claim 1, further comprising a step of relating said arc to a pnpn structure.

10. The method of claim 1, wherein said step of evaluating is carried out by calculating a transmission matrix for total minority carrier transmission across said domains.

11. The method of claim 10, wherein said transmission matrix is a higher order matrix.

12. The method of claim 1, further comprising a step of redesigning said chip to correct latchup or noise or defect determined in said determining step.

13. A method for evaluating minority carrier transmission across an array of unit cells in a semiconductor chip design, comprising the steps of
   a) forming said semiconductor chip design using shapes;
   b) evaluating, for each of said unit cells, minority carrier transmission across said unit cell by:
      defining an arc between a first point and a second point, wherein said first point and said second point are located on a boundary of said unit cell, and wherein said arc crosses at least one of said shapes;
      defining one or more domains in relation to points on said arc;
      quantifying absorption, reflection and transmission characteristics of each domain along said arc; and
      calculating an individual value for minority carrier transmission from said first point to said second point across said domains for said unit cell using said quantified characteristics;
   c) defining a second arc from a point A to a point B across said array of unit cells; and
   d) evaluating total minority carrier transmission along said arc by multiplying together individual values of minority transmission for all unit cells in said array of unit cells along said second arc;
   (e) determining latchup or noise or defect in said semiconductor chip design based on results of said evaluating step.

14. The method of claim 13, wherein each of said domains is delimited by two normal planes.

15. The method of claim 14, wherein each of said two normal planes includes a point co-located on said arc and on a perimeter of a shape.

16. The method of claim 14, wherein each of said two normal planes includes a bisector of a section of said arc, wherein said section is located between two adjacent points.

17. The method of claim 13, further comprising a step of removing shapes that are not in a substrate prior to said step of defining said arc.

18. The method of claim 13, further comprising a step of removing shapes within a well tub of a second doping polarity prior to said step of defining said arc.

19. The method of claim 13, wherein said unit cells are parameterized cells.

20. The method of claim 13, wherein said array of unit cells is selected from the group consisting of DRAM arrays, SRAM arrays, decoupling capacitors, off-chip driver (OCD) banks, receiver banks, ESD input networks, ESD power clamps, analog circuitry, gate array logic regions, custom logic, voltage islands, wiring bays, fill shapes, p-cell libraries, and periodic circuit functions.

21. The method of claim 13, further comprising a step of relating said arc to a pnpn structure.

* * * * *